(12) United States Patent
Kim

(10) Patent No.: US 12,086,342 B2
(45) Date of Patent: Sep. 10, 2024

(54) DISPLAY DEVICE HAVING SHAPED SEALING MEMBER

(71) Applicant: SAMSUNG DISPLAY CO., LTD., Yongin-si (KR)

(72) Inventor: Min Soo Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/303,896

(22) Filed: Apr. 20, 2023

(65) Prior Publication Data

US 2023/0259225 A1   Aug. 17, 2023

Related U.S. Application Data

(63) Continuation of application No. 17/659,427, filed on Apr. 15, 2022, now Pat. No. 11,635,836, which is a
(Continued)

(30) Foreign Application Priority Data

Mar. 23, 2018   (KR) .................. 10-2018-0034076

(51) Int. Cl.
*G06F 3/041*   (2006.01)
*G09G 3/22*   (2006.01)
(Continued)

(52) U.S. Cl.
CPC ............. *G06F 3/0412* (2013.01); *G09G 3/22* (2013.01); *G09G 3/3208* (2013.01);
(Continued)

(58) Field of Classification Search
CPC .... G09G 3/3208; G09G 3/22; H01L 27/3276; H01L 51/5246; H01L 27/323; G06F 3/0412
See application file for complete search history.

(56) References Cited

U.S. PATENT DOCUMENTS 9,807,898 B2   10/2017   Lee et al.
D806,705 S   1/2018   Akana et al.
(Continued)

FOREIGN PATENT DOCUMENTS

CN   102231426   11/2011
CN   105301807   2/2016
(Continued)

OTHER PUBLICATIONS

Extended European Search Report Dated Aug. 29, 2019 for Application Serial No. 19155052.4.
(Continued)

*Primary Examiner* — Deeprose Subedi
(74) *Attorney, Agent, or Firm* — F. Chau & Associates, LLC

(57) ABSTRACT

A display device includes a first substrate having a light-emitting element. A second substrate is disposed over the first substrate. A sealing member is disposed between the first substrate and the second substrate. The sealing member couples the first substrate and the second substrate together. The sealing member includes a first linear portion extending in a first direction, and a second linear portion extending in a second direction different from the first direction. A maximum width of the first linear portion is greater than a maximum width of the second linear portion.

21 Claims, 24 Drawing Sheets

Related U.S. Application Data continuation of application No. 17/001,281, filed on Aug. 24, 2020, now Pat. No. 11,307,693, which is a continuation of application No. 16/192,370, filed on Nov. 15, 2018, now Pat. No. 10,754,463.

(51) Int. Cl.
    *G09G 3/3208*    (2016.01)
    *H10K 50/842*    (2023.01)
    *H10K 59/131*    (2023.01)
    *H10K 59/40*     (2023.01)

(52) U.S. Cl.
    CPC ....... *H10K 50/8426* (2023.02); *H10K 59/131* (2023.02); *H10K 59/40* (2023.02)

(56) References Cited

U.S. PATENT DOCUMENTS

| | | |
|---|---|---|
| 10,345,939 B2 | 7/2019 | Kim |
| 10,409,114 B2 | 9/2019 | Iwai et al. |
| 10,754,463 B2 | 8/2020 | Kim |
| 11,102,898 B2 | 8/2021 | Lee et al. |
| 11,307,693 B2 | 4/2022 | Kim |
| 2009/0066242 A1 | 3/2009 | Koo |
| 2015/0131044 A1 | 5/2015 | Park et al. |
| 2016/0029502 A1 | 1/2016 | Lee et al. |
| 2017/0123245 A1 | 5/2017 | Iwai et al. |
| 2017/0365814 A1 | 12/2017 | Kim et al. |
| 2018/0004330 A1 | 1/2018 | Kim |
| 2018/0224957 A1* | 8/2018 | Lim ................ H05K 1/148 |
| 2019/0294281 A1 | 9/2019 | Kim |
| 2020/0387254 A1 | 12/2020 | Kim |
| 2022/0238821 A1 | 7/2022 | Kim |

FOREIGN PATENT DOCUMENTS

| | | |
|---|---|---|
| CN | 304301463 S | 9/2017 |
| CN | 107544710 | 1/2018 |
| JP | 2017-090528 | 5/2017 |
| JP | 2017-181816 | 10/2017 |
| KR | 10-2018-0002943 | 1/2018 |
| TW | 2016-05038 | 2/2016 |

OTHER PUBLICATIONS

Korean Office Action for Application Serial No. 10-2018-0034076 Dated Aug. 19, 2022.

* cited by examiner

DISPLAY DEVICE HAVING SHAPED SEALING MEMBER

This application is a Continuation of co-pending U.S. patent application Ser. No. 17/659,427, filed on Apr. 15, 2022, which is a Continuation of U.S. patent application Ser. No. 17/001,281, filed on Aug. 24, 2020 (issued on Apr. 19, 2022 as U.S. Pat. No. 11,307,693), which is a Continuation of U.S. patent application Ser. No. 16/192,370, filed on Nov. 15, 2018 (issued on Aug. 25, 2020 as U.S. Pat. No. 10,754,463), which claims priority to Korean Patent Application No. 10-2018-0034076 filed on Mar. 23, 2018 in the Korean Intellectual Property Office, the disclosures of which are herein incorporated by reference in their entirety.

BACKGROUND

Technical Field

The present invention relates to a display device and, more specifically, to a display device having a shaped sealing member.

Discussion of the Related Art

Display devices may be applied to portable electronics such as smart phones, smart watches, tablet PCs, and notebook computers, or large electronic devices such as televisions, monitors, and digital information displays.

Recently, display devices have been designed to have a slimmer bezel so as to provide electronic devices with a wider screen without increasing the size of the electronic device.

As display devices are often used in portable electronics, such as smartphones, in which a speaker module and one or more optical sensors are disposed, one method for reducing bezel size is to create a display device having a display area that is atypically shaped to have a notch or trench shape in a top region thereof. However, when the display area is atypically formed, the durability of the display device may deteriorate.

SUMMARY

A display device includes a first substrate having a light-emitting element. A second substrate is disposed over the first substrate. A sealing member is disposed between the first substrate and the second substrate. The sealing member couples the first substrate and the second substrate together. The sealing member includes a first linear portion extending in a first direction, and a second linear portion extending in a second direction different from the first direction. A maximum width of the first linear portion is greater than a maximum width of the second linear portion.

A display device includes a first substrate having a first base substrate and a light-emitting element disposed on the first base substrate. A second substrate is disposed over the first substrate. A sealing member is disposed between the first substrate and the second substrate, the sealing member coupling the first substrate and the second substrate together. The first base substrate includes a main portion having a maximum width in a first direction, and a protruding portion protruding from the main portion in a second direction different from the first direction and having a second maximum width smaller than the first maxim width in the first direction. A maximum width of the sealing member overlapping the protruding portion is greater than a maximum width of the sealing member overlapping the main portion.

A display device, in which a display area and a non-display area are defined, includes a first substrate having a first base substrate and a light-emitting element disposed on the first base substrate. A second substrate is disposed over the first substrate. A sealing member is disposed between the first substrate and the second substrate, coupling the first substrate and the second substrate together. The sealing member includes a first portion extending in a first direction and a second portion extending in a second direction different from the first direction. One side edge of the first base substrate in the second direction has an at least partially indented shape. The one side edge includes a first edge extending in the first direction and a second edge extending in the first direction and indented relative to the first edge. A maximum width of the sealing member adjacent to the first edge and extending in the first direction is greater than a maximum width of the sealing member adjacent to the second edge and extending in the first direction.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
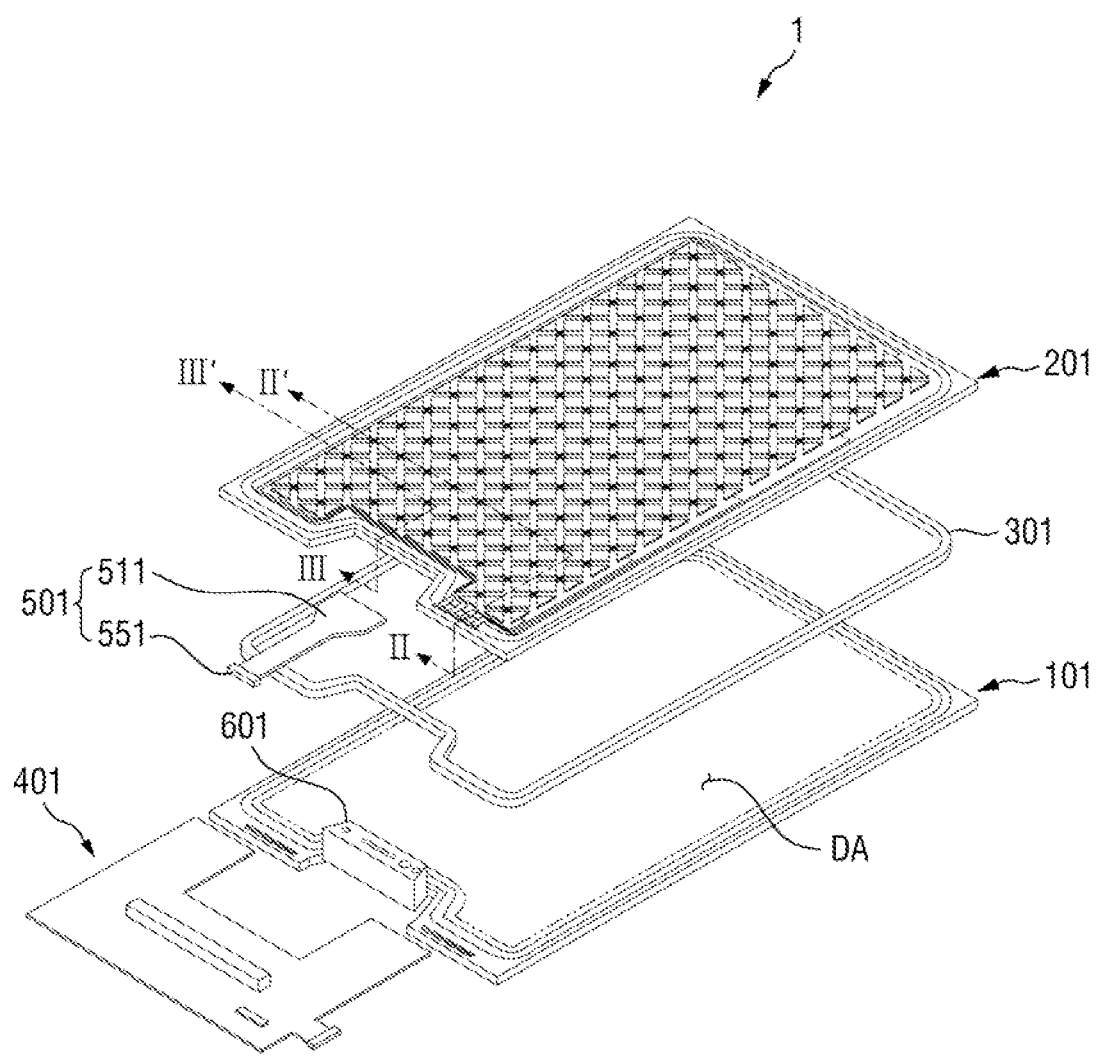
FIG. 1 is an exploded perspective view illustrating a display device according to an exemplary embodiment of the present invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art. Like reference numerals may refer to like elements throughout the specification and the drawings.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

As used herein, the first direction X is any one direction in a plane, the second direction Y is a direction intersecting the first direction X in the plane, and the third direction Z is a direction perpendicular to the plane.

Unless otherwise defined, the "plane" refers to a plane to which the first direction X and the second direction Y belong. Further, unless otherwise defined, the "overlapping" refers to overlapping in the third direction Z on a plane.

Hereinafter, exemplary embodiments of the present invention will be described with reference to the attached drawings.

Figure 2:
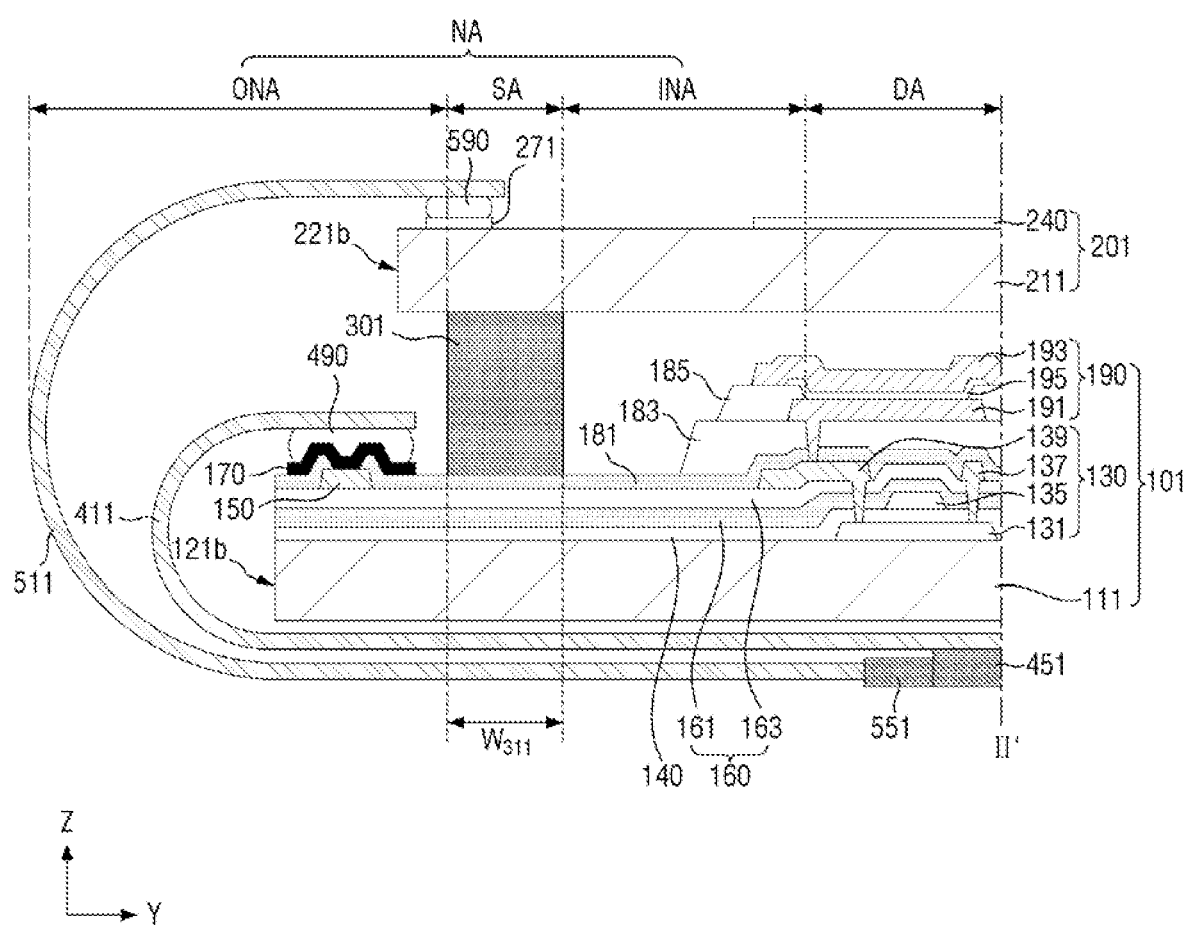
FIG. 2 is a cross-sectional view illustrating the display device of FIG. 1, taken along line II-II' in FIG. 1.
Figure 3:
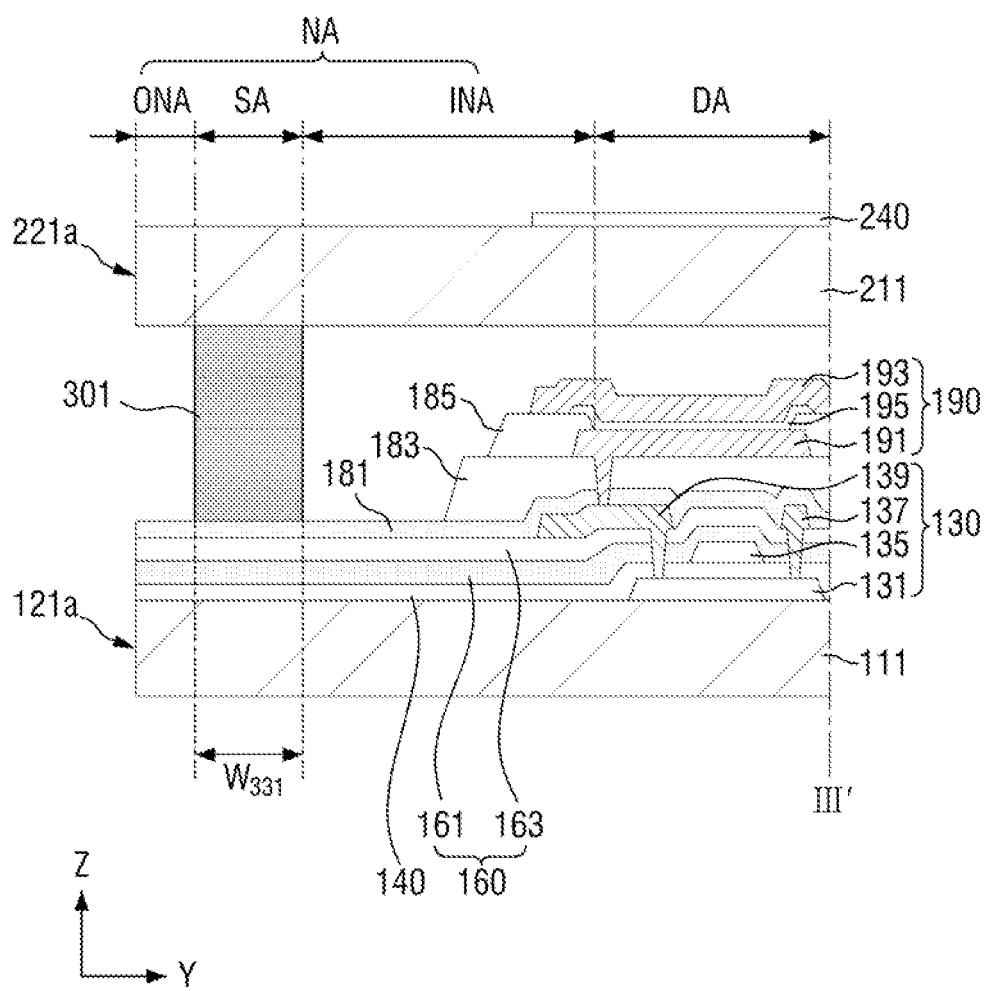
FIG. 3 is a cross-sectional view illustrating the display device of FIG. 1, taken along line III-III' in FIG. 1.
Figure 4:
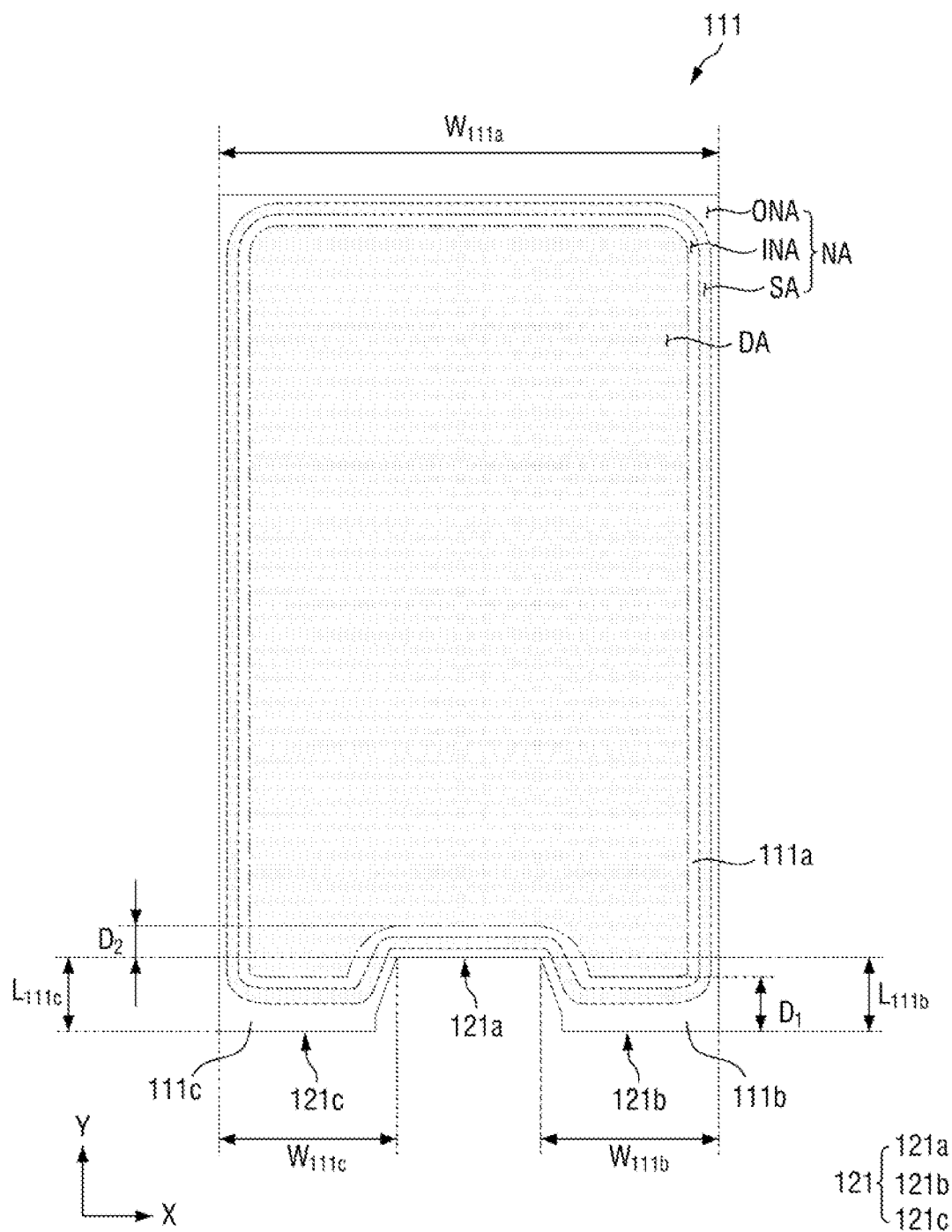
FIG. 4 is a plan view illustrating a first base substrate of a light-emitting substrate of FIG. 1.
Figure 5:
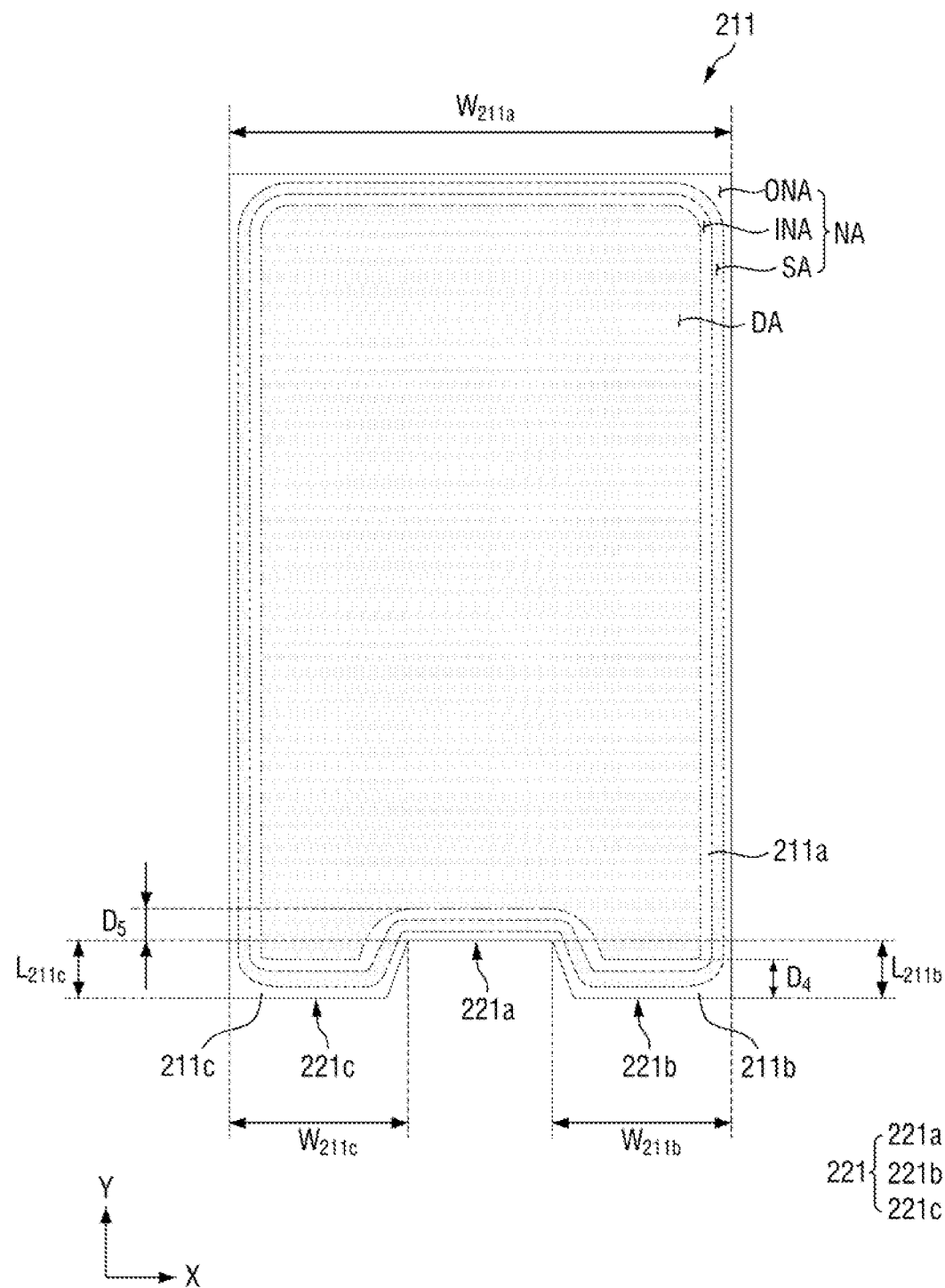
FIG. 5 is a plan view illustrating a second base substrate of the counter substrate of FIG. 1.

FIG. 1 is an exploded perspective view illustrating a display device 1 according to an exemplary embodiment of the present invention. FIG. 2 is a cross-sectional view illustrating the display device 1 of FIG. 1, taken along line II-II' in FIG. 1. FIG. 3 is a cross-sectional view illustrating the display device 1 of FIG. 1, taken along line III-III' in FIG. 1. FIG. 4 is a plan view illustrating a first base substrate 111 of a light-emitting substrate 101 of FIG. 1. FIG. 5 is a plan view illustrating a second base substrate 211 of a counter substrate 201 of FIG. 1.

Referring to FIGS. 1 to 5, in the display device 1 according to an exemplary embodiment of the present invention, a display area DA and a non-display area NA (See, for example, FIG. 2) may be defined.

The display area DA may include a plurality of pixels and may provide image display. As used herein, the term "pixel" refers to a smallest unit area for generating a point of color. Each pixel may express a predetermined basic color. Examples of the basic color may include, but are not limited to, red, green, and blue. In an exemplary embodiment of the present invention, in a plan view, the display area DA may have a shape in which one side edge (for example, a lower edge in FIG. 4) is partially indented. For example, one side edge of the display area DA in the second direction Y may have an atypical shape such as a bay, a notch, or a trench, in a plan view.

In a plan view, the display area DA may be at least partially surrounded by the non-display area NA. The non-display area NA refers to an area not contributing to image display. The non-display area NA may include a sealing area SA in which a sealing member 301 is disposed, an inner non-display area INA located inward from the sealing area SA (e.g., between the display area DA and the sealing area SA), and an outer non-display area ONA located outward from the sealing area SA.

In an exemplary embodiment of the present invention, the display device 1 includes a light-emitting substrate 101, a counter substrate 201 disposed over the light-emitting substrate 101, and a sealing member 301 disposed between the light-emitting substrate 101 and the counter substrate 201 and coupling the light-emitting substrate 101, and the counter substrate 201. The display device 1 may further include a first flexible circuit film 401, a second flexible circuit film 501, and a module member 601.

The light-emitting substrate 101 (for example, a first substrate) may include a light-emitting element 190 capable of emitting light by itself to provide light necessary for image display. For example, the light-emitting substrate 101 may be a display substrate including the light emitting elements 190 disposed at each pixel. The light emitting elements 190 disposed at each pixel may emit light independently of each other, thereby implementing image display and color expression.

The first base substrate 111 may provide a space for stably disposing the light emitting element 190 and the like. The upper surface of the first base substrate 111 may be placed in a plane to which the first direction X and the second direction Y belong. The first base substrate 111 may be a transparent or opaque insulating plate or insulating film. For example, the first base substrate 111 may include a glass material, a quartz material, or the like. For example, the first base substrate 111 may include a polymer material such as an imide resin, a carbonate resin, and/or an acrylic resin.

In an exemplary embodiment of the present invention, in a plan view, the first base substrate 111 may include a main portion 111a (see, FIG. 4) having a first maximum width $W_{111a}$ in the first direction X, a first protruding portion 111b protruding from the main portion 111a in the second direction Y, and a second protruding portion 111c protruding from the main portion 111a in the second direction Y and spaced apart from the first protruding portion 111b in the first direction X. The first protruding portion 111b of the first base substrate 111 may have a second maximum width $W_{111b}$ in the first direction X, and the second protruding portion 111c thereof may have a third maximum width $W_{111b}$ in the first direction X. Each of the second maximum width $W_{111b}$ and the third maximum width $W_{111b}$ may be smaller than the first maximum width $W_{111a}$. For example, the sum of the second maximum width $W_{111b}$ and the third maximum width $W_{111c}$ may be smaller than the first maximum width $W_{111a}$. The second maximum width $W_{111b}$ and the third maximum width $W_{111c}$ of the first base substrate 111 may be the same as or different from each other. In addition, the first base substrate 111 may have a shape in which the maximum length thereof in the second direction Y is longer than the length thereof in the first direction X, for example, the first maximum width $W_{111a}$.

At least a part of the display area DA of the display device 1 may overlap the first protruding portion 111b and second protruding portion 111c of the first base substrate 111. For example, pixels are defined in the first protruding portion 111b and second protruding portion 111c of the first base substrate 111 as well as in the main portion 111a of the first base substrate 111, and each of these three portions may contribute to image display and color expression. While the display area DA is not formed to overlap the module member 601, the display area DA is formed adjacent to the module member 601 along three sides thereof (two sides in the first direction X and 1 side in the second direction Y), thereby minimizing the planar area of the non-display area NA and increasing the planar area of the display area DA.

One side edge (for example, a lower edge in FIG. 4) of the display area DA in the second direction Y may have an atypical shape such as a bay, a notch, or a trench, in a plan view. For example, one side edge 121 of the first base substrate 111 may be partially indented. For example, one side edge 121 of the first base substrate 111 may include a first edge 121b, a second edge 121a indented from the first edge 121b, and a third edge 121c protruding from the second edge 121a.

The first edge 121b refers to one side edge of the first protruding portion 111b of the first base substrate 111 in the second direction Y, the second edge 121a refers to one side edge of the main portion 111a of the first base substrate 111 in the second direction Y, and the third edge 121c refers to one side edge of the second protruding portion 111c of the first base substrate 111 in the second direction Y. The first protruding portion 111b, second protrusion portion 111c and second edge 121a of the first base substrate 111 may together form a bay.

In an exemplary embodiment of the present invention, the shortest distance $D_1$ from the first edge 121b to the display area DA in the second direction Y may be larger than the shortest distance $D_2$ from the second edge 121a to the display area DA in the second direction Y. Further, the shortest distance from the third edge 121c to the display area DA in the second direction Y may be larger than the shortest distance $D_2$ from the second edge 121a to the display area DA in the second direction Y.

As will be described later, the shortest distance $D_1$ from the first edge 121b to the display area DA is larger than the shortest distance $D_2$ from the second edge 121a to the display area DA, thereby sufficiently securing the width of a portion extending in the first direction X (for example, a first linear portion 311 to be described later) of the sealing member 301 disposed on the first protruding portion 111b. Further, a light-emitting substrate pad unit 170 is not disposed between the second edge 121a and the sealing member 301, thereby securing a space for disposing the module member 601 between the first protruding portion 111b and second protruding 111c of the first base substrate 111.

A driving layer including a thin film transistor 130, wirings 150, and a light-emitting substrate pad unit 170 may be disposed on the first base substrate 111. For convenience of explanation, although FIG. 2 and the like show one thin film transistor 130, in some exemplary embodiments of the present invention, the driving layer may further include a plurality of thin film transistors and/or auxiliary electrodes for forming a capacitor or a bridge.

The thin film transistor 130 may be electrically connected to the light-emitting element 190. For example, the thin film transistor 130 may be a driving transistor configured to control the amount of current provided to the light-emitting element 190 in a specific pixel. However, the present invention is not limited thereto, and the thin film transistor 130 may be a switching transistor configured to control a specific pixel to be on or off, a compensation transistor for compensating a driving signal, an initialization transistor in which an initializing signal is applied to a gate electrode, or a light emission control transistor in which a light emission control signal is applied to a gate electrode.

The thin film transistor 130 may include an active layer 131 for forming a channel, a gate electrode 135 which is a control terminal, a source electrode 137 which is an input terminal, and a drain electrode 139 which is an output terminal.

The active layer 131 may be disposed on the first base substrate 111. Although FIG. 2 and the like show a case where the active layer 131 is directly disposed on the first base substrate, alternatively, at least one inorganic layer may be disposed between the first base substrate 111 and the active layer 131. The active layer 131 may include a semiconductor material. For example, the active layer 131 may include polycrystalline silicon, or may include an oxide semiconductor.

The gate electrode 135 may be disposed on the active layer 131. The gate electrode 135 may at least partially overlap the channel region of the active layer 131 in the third direction Z. The gate electrode 135 may include aluminum, molybdenum, copper, titanium, and/or an alloy thereof. The gate electrode 135 may be formed of a single layer, or may have a laminate structure including a plurality of layers. The gate electrode 135 may constitute a control terminal configured to carry a control signal of the thin film transistor 130. In an exemplary embodiment of the present invention in which the thin film transistor 130 is a driving transistor, the gate electrode 135 may be electrically connected to an output terminal of a switching transistor for controlling a specific pixel to be on or off. A first insulating layer 140 is interposed between the active layer 131 and the gate electrode 135 to insulate them from each other. The first insulating layer 140 may be a gate insulating layer. The first insulating layer 140 may include an inorganic insulating material. The inorganic insulating material may include silicon nitride, silicon oxide, silicon oxynitride, and/or silicon oxynitride.

The source electrode 137 and the drain electrode 139 may be disposed on the gate electrode 135. The source electrode 137 and the drain electrode 139 are electrically connected to the source region and the drain region of the active layer 131, respectively, and may be spaced apart from each other. Each of the source electrode 137 and the drain electrode 139 may include aluminum, molybdenum, copper, titanium, and/or an alloy thereof. Each of the source electrode 137 and the drain electrode 139 may be formed of a single layer or may have a laminate structure including a plurality of layers. The source electrode 137 may constitute an input terminal to which the input signal of the thin film transistor 130 is applied, and the drain electrode 139 may constitute an output terminal to which the output signal of the thin film transistor 130 is applied. In an exemplary embodiment of the present disclosure in which the thin film transistor 130 is a driving transistor, the source electrode 137 may be electrically connected to a driving voltage wiring configured to carry a driving voltage, and the drain electrode 139 may be electrically connected to the anode 191 of the light-emitting element 190.

An interlayer insulating layer 160 including a second insulating layer 161 and a third insulating layer 163 may be interposed between the gate electrode 135 and the source electrode 137 and between the gate electrode 135 and the drain electrode 139. The interlayer insulating layer 160 may isolate the gate electrode 135, the source electrode 137, the drain electrode 139, and auxiliary electrodes from each other. Each of the second insulating layer 161 and the third insulating layer 163 may include an inorganic insulating material. The inorganic insulating material may include silicon nitride, silicon oxide, silicon oxynitride, and/or silicon oxynitride.

A protective layer 181 may be disposed on the source electrode 137 and the drain electrode 139. The protective layer 181 may cover the source electrode 137 and the drain electrode 139 to prevent the source electrode 137 and the drain electrode 139 from coming into contact with an organic material.

The wirings 150 may be located at least partially in the non-display area NA, for example, the outer non-display area ONA. The wirings 150 may extend from the non-display area NA to the display area DA to transmit a signal provided from an external driving element to the thin film transistor 130 or the like. For example, the wirings 150 may be electrically connected to the light-emitting substrate pad unit 170 to transmit a signal provided from the first flexible circuit film 401 to the thin film transistor 130 or the like. The wirings 150 may include a scan wiring configured to carry a scan signal, a data wiring configured to carry a data signal, and a drive voltage wiring configured to carry a drive voltage. FIG. 2 and the like illustrate a case where the wirings 150 are disposed on the same layer as the source electrode 137 and the drain electrode 139, but the present invention is not limited thereto.

The light-emitting substrate pad unit 170 (for example, a first pad unit) may be disposed in the non-display area NA. For example, the light-emitting substrate pad unit 170 may be disposed entirely within the outer non-display area ONA. In this case, the wirings 150 electrically connected to the light-emitting substrate pad unit 170 may be arranged to cross the sealing area SA. In some exemplary embodiments of the present invention, the light-emitting substrate pad unit 170 may include a pad electrode. The pad electrode has an expanded area, and may be electrically connected to the wirings 150 through a contact hole formed in the protective layer 181. However, the present invention is not limited thereto, and alternatively, the ends of the wirings 150 may extend to form the light-emitting substrate pad unit 170 for electrical connection.

Further, the light-emitting substrate pad unit 170 may be disposed adjacent to one side edge 121 of the first base substrate 111 in the second direction Y. In an exemplary embodiment of the present invention, the light-emitting substrate pad unit 170 is disposed adjacent to the first edge 121b and the third edge 121c of the first base substrate 111, but might not be disposed adjacent to the second edge 121a. For example, in a plan view, the light-emitting substrate pad unit 170 is disposed between the first edge 121b and the sealing member 301 and between the third edge 121c and the sealing member 301, but might not be disposed between the second edge 121a and the sealing member 301. The light-emitting substrate pad unit 170 is disposed on the first protruding portion 111b and the second protruding portion 111c of the first base substrate 111, but is not disposed on the main portion 111a, thereby minimizing the shortest distance D2 from the second edge 121a to the display area DA and reducing the area of the non-display area NA. In addition, a space for disposing a module member 601 is accordingly provided.

A step compensating layer 183 may be disposed on the wiring layer. The step compensating layer 183 has a step compensating function for at least partially compensating the step formed by the driving layer including the thin film transistor 130 and the like, and may provide a space for stably disposing the light-emitting element 190. The material of the step compensating layer 183 is not particularly limited as long as it has high light transmittance and has step compensating characteristics and insulating characteristics, but examples thereof may include organic materials such as an acrylic resin, an epoxy resin, an imide resin, a cardo-based resin, and an ester resin.

The light-emitting element 190 may be disposed on the step compensating layer 183. The light-emitting element 190 may include an anode 191 (for example, a lower electrode), a cathode 193 (for example, an upper electrode), and a light-emitting layer 195 interposed between the anode 191 and the cathode 193. For example, the light-emitting layer 195 may be an organic light-emitting layer including an organic light-emitting material, and the light-emitting element 190 may be an organic light-emitting element. The light-emitting element 190 may emit only blue light, emit only green light, emit only red light, or emit white light mixed therewith, depending on the material or laminate structure of the light-emitting layer 195.

The anode 191 may be a pixel electrode disposed for each pixel and provided with driving signals independently of each other. The anode 191 may be electrically connected to the drain electrode 139 of the thin film transistor 130 through the contact hole formed in the step compensating layer 183 and the interlayer insulating layer 160. The anode 191 may be a transparent electrode, an opaque electrode, or a laminate structure including both a transparent electrode and an opaque electrode. Examples of the material for forming the transparent electrode may include indium tin oxide (ITO), indium zinc oxide (IZO), zinc oxide, and/or indium oxide, and examples of the material for forming the opaque electrode may include lithium (Li), aluminum (Al), magnesium (Mg), silver (Ag), nickel (Ni), and/or chromium (Cr).

The cathode 193 may be a common electrode which is disposed to overlap the anode 191 in the third direction Z and the cathode 193 may be continuously disposed over a plurality of pixels without interruption. For example, the plurality of light-emitting elements 190 disposed in different pixels from each other may share the cathode 193 with each other. Like the anode 191, the cathode 193 may be a transparent electrode, an opaque electrode, or a laminate structure including both a transparent electrode and an opaque electrode.

The light-emitting layer 195 may be interposed between the anode 191 and the cathode 193. Within the light-emitting layer 195, holes and electrons transferred from the anode 191 and the cathode 193, respectively, may recombine to generate light. For example, the holes and electrons are recombined in the light-emitting layer 195 to generate excitons, and the excitons emit light as they relax from the excited state to the ground state. The light-emitting layer 195 may include a material that phosphoresces or fluoresces only blue light, a material that phosphoresces or fluoresces only green light, and/or a material that phosphoresces or fluoresces only red light.

A hole control auxiliary layer such as a hole injection layer, a hole transport layer, or a hole blocking layer; an electron control auxiliary layer such as an electron injection layer, an electron transport layer, or an electron blocking layer; and/or a charge generating auxiliary layer may be further interposed between the light-emitting layer 195 and the anode 191 and/or between the light-emitting layer 195 and the cathode 193, so that the light-emitting efficiency of the light-emitting element 190 can be increased.

In some exemplary embodiments of the present invention, a pixel defining film 185 may be further disposed on the anode 191. The aforementioned light emitting layer 195 and the cathode 193 may be disposed on the pixel defining film 185. In a plan view, the pixel defining film 185 may have an opening partially exposing the anode 191. The pixel defining film 185 may isolate the anode 191 and the cathode 193 from each other, and may partition a plurality of pixels. The pixel defining film 185 may include an organic material such as an acrylic resin, an epoxy resin, an imide resin, and/or an ester resin.

Next, the counter substrate 201 will be described. The counter substrate 201 (for example, a second substrate) may face the light-emitting substrate 101. For example, the counter substrate 201 may be an encapsulating substrate that is disposed over the light-emitting substrate 101 and encapsulates the light-emitting element 190 together with a sealing member 301 to be described later. The counter substrate 201 may include a second base substrate 211, and may further include a touch element layer 231.

The second base substrate 211 is configured to encapsulate the light-emitting element 190 to prevent the light emitting element 190 from being damaged by air, moisture, or the like. The second base substrate 211 may be a transparent plate or a transparent film. For example, the second base substrate 211 may include a glass material, a quartz material, or the like. In some exemplary embodiments of the present invention, the second base substrate 211 and the light-emitting element 190 may be spaced apart from each other, and an inert gas such as nitrogen gas may be disposed therebetween. However, the present invention is not limited thereto, and the space between the second base substrate 211 and the light-emitting element 190 may be filled with a filler or the like.

In an exemplary embodiment of the present invention, in a plan view, the second base substrate 211 may include a main portion 211a having a fourth maximum width $W_{211a}$ in the first direction X, a first protruding portion 211b protruding from the main portion 211a in the second direction Y, and a second protruding portion 211c protruding from the main portion 211a in the second direction Y and spaced apart from the first protruding portion 211b in the first direction X. The first protruding portion 211b of the second base substrate 211 may have a fifth maximum width $W_{211b}$ in the first direction X, and the second protruding portion 211c thereof may have a sixth maximum width $W_{211b}$ in the first direction X. Each of the fifth maximum width $W_{210b}$ and the sixth maximum width $W_{211c}$ may be smaller than the fourth maximum width $W_{211a}$. For example, the sum of the fifth maximum width $W_{211b}$ and the sixth maximum width $W_{211c}$ may be smaller than the fourth maximum width $W_{211a}$. The fifth maximum width $W_{211b}$ and the sixth maximum width $W_{211c}$ of the second base substrate 211 may be the same as or different from each other. In addition, the second base substrate 211 may have a shape in which the maximum length thereof in the second direction Y is longer than the length thereof in the first direction X, for example, the fourth maximum width $W_{211a}$.

The planar area of the second base substrate 211 may be smaller than the planar area of the first base substrate 111.

For example, the main portion 111a of the first base substrate 111 and the main portion 211a of the second base substrate 211 may overlap each other in the third direction Z. Further, the main portion 111a of the first base substrate 111 has substantially the same shape as the main portion 211a of the second base substrate 211, and may have substantially the same area as the main portion 211a of the second base substrate 211. For example, the maximum width $W_{111a}$ of the main portion 111a of the first base substrate 111 in the first direction X may be substantially the same as the maximum width $W_{211a}$ of the main portion 211a of the second base substrate 211 in the first direction X, and the length of the main portion 111a of the first base substrate 111 in the second direction Y may be substantially the same as the length of the main portion 211a of the second base substrate 211 in the second direction Y.

The first protruding portion 111b of the first base substrate 111 and the first protruding portion 211b of the second base substrate 211 may overlap the second protruding portion 111c of the first base substrate 111 and the second protruding portion 211c of the second base substrate 211 in the third direction Z, respectively. The first protruding portion 111b of the first base substrate 111 may have a larger planar area than the first protruding portion 211b of the second base substrate 211, and the second protruding portion 111c of the first base substrate 111 may have a larger planar area than the second protruding portion 211c of the second base substrate 211.

In an exemplary embodiment of the present invention, the second maximum width $W_{111b}$ of the first protruding portion 111b of the first base substrate 111 in the first direction X may be substantially the same as the fifth maximum width $W_{211b}$ of the first protruding portion 211b of the second base substrate 211 in the first direction X, and the length $L_{111b}$ of the first protruding portion 111b of the first base substrate 111 in the second direction Y may be greater than the length $L_{211b}$ of the first protruding portion 211b of the second base substrate 211 in the second direction Y.

Similarly, the third maximum width $W_{111c}$ of the second protruding portion 111c of the first base substrate 111 in the first direction X may be substantially the same as the sixth maximum width $W_{211c}$ of the second protruding portion 211c of the second base substrate 211 in the first direction X, and the length $L_{111c}$ of the second protruding portion 111c of the first base substrate 111 in the second direction Y may be greater than the length $L_{211c}$ of the second protruding portion 211c of the second base substrate 211 in the second direction Y.

The first protruding portion 111b and the second protruding portion 111c of the first base substrate 111, which are not covered by the first protruding portion 211b and the second protruding portion 211c of the second base substrate 211, may be provided with the light-emitting substrate pad unit 170.

At least a part of the display area DA of the display device 1 may overlap the first protruding portion 211b and second protruding portion 211c of the second base substrate 211. For example, pixels are defined in the first protruding portion 211b and second protruding portion 211c of the second base substrate 211 as well as in the main portion 211a of the second base substrate 211, and the pixels may contribute to image display and color expression. Except for an area where a module member 601, to be described later, is disposed, the display area DA is formed around three sides of the module member 601 (two sides in the first direction X, and 1 side in the second direction Y) thereby minimizing the planar area of the non-display area NA and increasing the planar area of the display area DA.

One side edge (for example, a lower edge in FIG. 5) of the second base substrate 211 in the second direction Y may have an atypical shape such as a bay, a notch, or a trench, in a plan view. For example, one side edge 221 of the second base substrate 211 may be partially indented. For example, one side edge 221 of the second base substrate 211 may include a fourth edge 221b, a fifth edge 221a indented from the fourth edge 221b, and a sixth edge 221c protruding from the fifth edge 221a.

The fourth edge 221b refers to one side edge of the first protruding portion 211b of the second base substrate 211 in the second direction Y, the fifth edge 221a refers to one side edge of the main portion 211a of the second base substrate 211 in the second direction Y, and the sixth edge 221c refers to one side edge of the second protruding portion 211b of the second base substrate 211 in the second direction Y. The first protruding portion 211b, second protrusion portion 211c and fifth edge 221a of the second base substrate 211 may together form a bay.

In an exemplary embodiment of the present invention, the shortest distance $D_4$ from the fourth edge 221b to the display area DA in the second direction Y may be larger than the shortest distance $D_5$ from the fifth edge 221a to the display area DA in the second direction Y. Further, the shortest distance from the sixth edge 221c to the display area DA in the second direction Y may be larger than the shortest distance $D_5$ from the fifth edge 221a to the display area DA in the second direction Y. In some exemplary embodiments of the present invention, the shortest distance $D_1$ from the first edge 121b to the display area DA may be larger than the shortest distance $D_4$ from the fourth edge 221b to the display area DA, and the shortest distance $D_2$ from the second edge 121a to the display area DA may be substantially equal to the shortest distance $D_5$ from the fifth edge 221a to the display area DA.

As will be described later, the shortest distance $D_4$ from the fourth edge 221b to the display area DA is larger than the shortest distance $D_5$ from the fifth edge 221a to the display area DA, thereby sufficiently securing the width of a portion extending in the first direction X (for example, a first linear portion 311 to be described later) of the sealing member 301 disposed on the first protruding portion 211b.

In addition, the first edge 121b of the first base substrate 111 protrudes from the fourth edge 221b of the second base substrate 211 to support the light-emitting substrate pad unit 170, and the second edge 121a of the first base substrate 111 is aligned with the fifth edge 221a of the second base substrate 211, thereby minimizing the area occupied by the light-emitting substrate pad unit 170 and further reducing the area of the non-display area NA.

Hereinafter, a touch element layer 231, including a touch electrode layer 240, touch wirings, 251, and a touch pad unit 271, of the display device 1 according to an exemplary embodiment of the present disclosure will be described in detail with reference to FIGS. 6 to 9.

Figure 6:
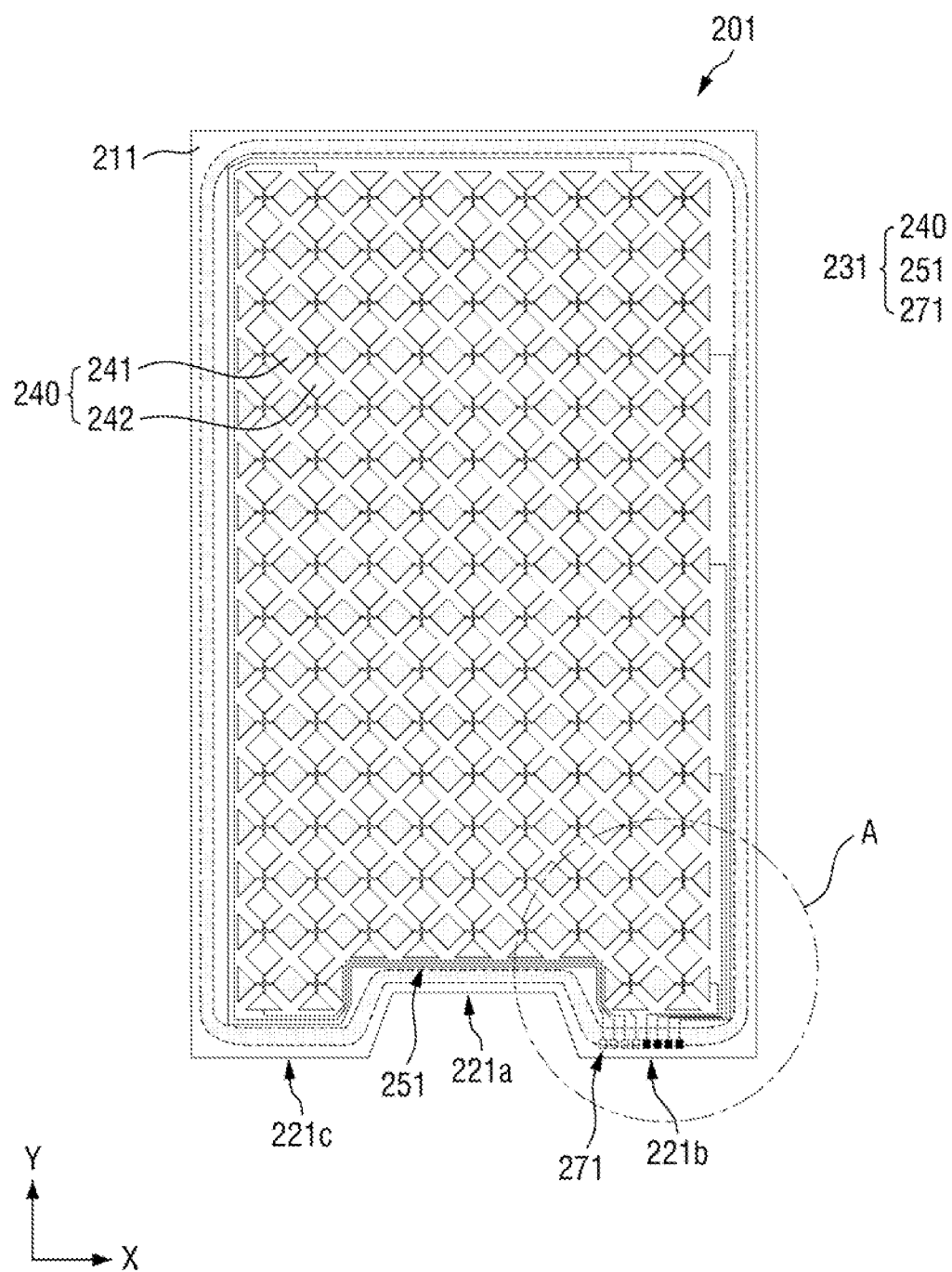
FIG. 6 is a plan view illustrating a touch element layer of the counter substrate of FIG. 1.
Figure 7:
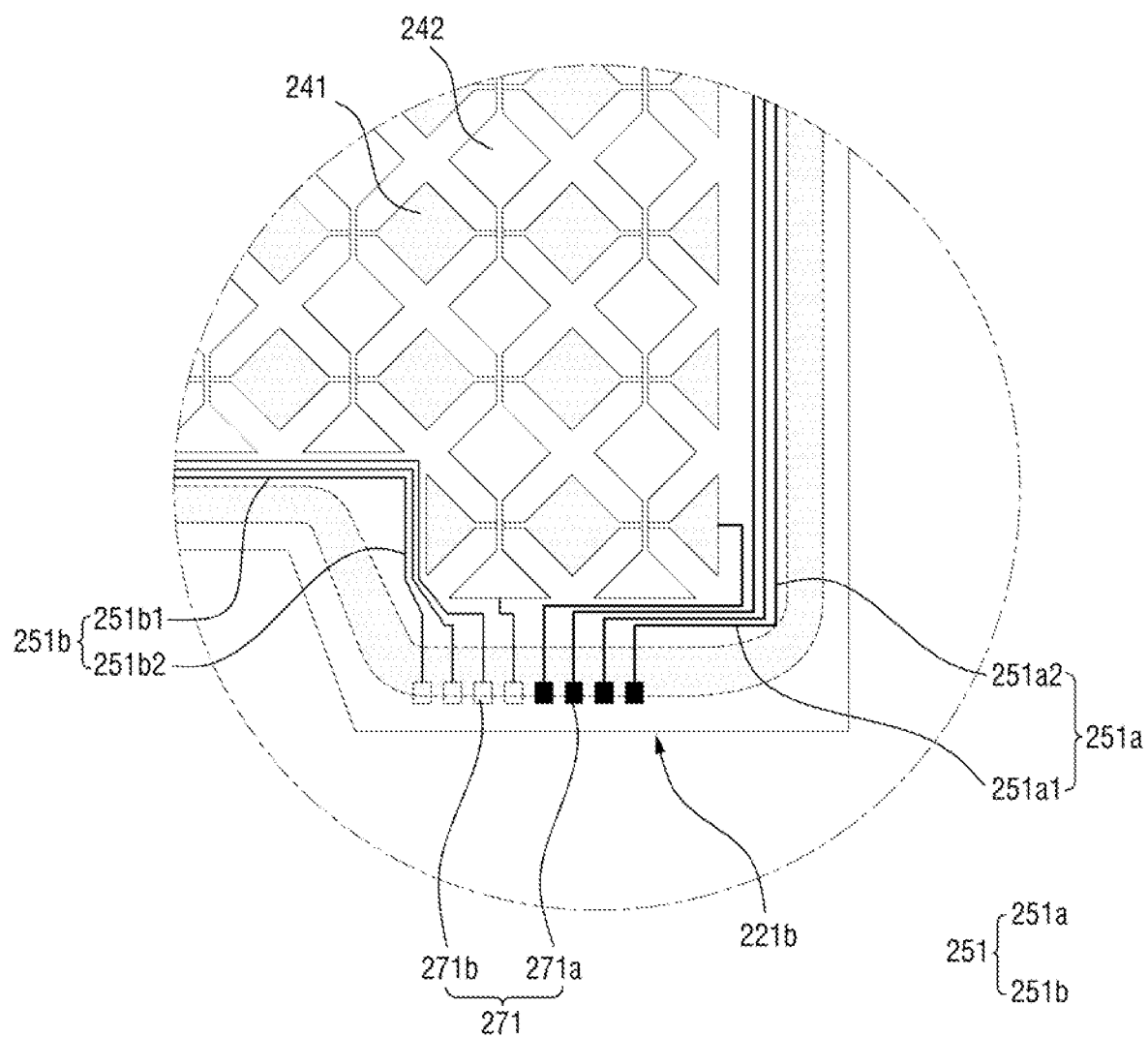
FIG. 7 is an enlarged view illustrating the area A in FIG. 6.
Figure 8:
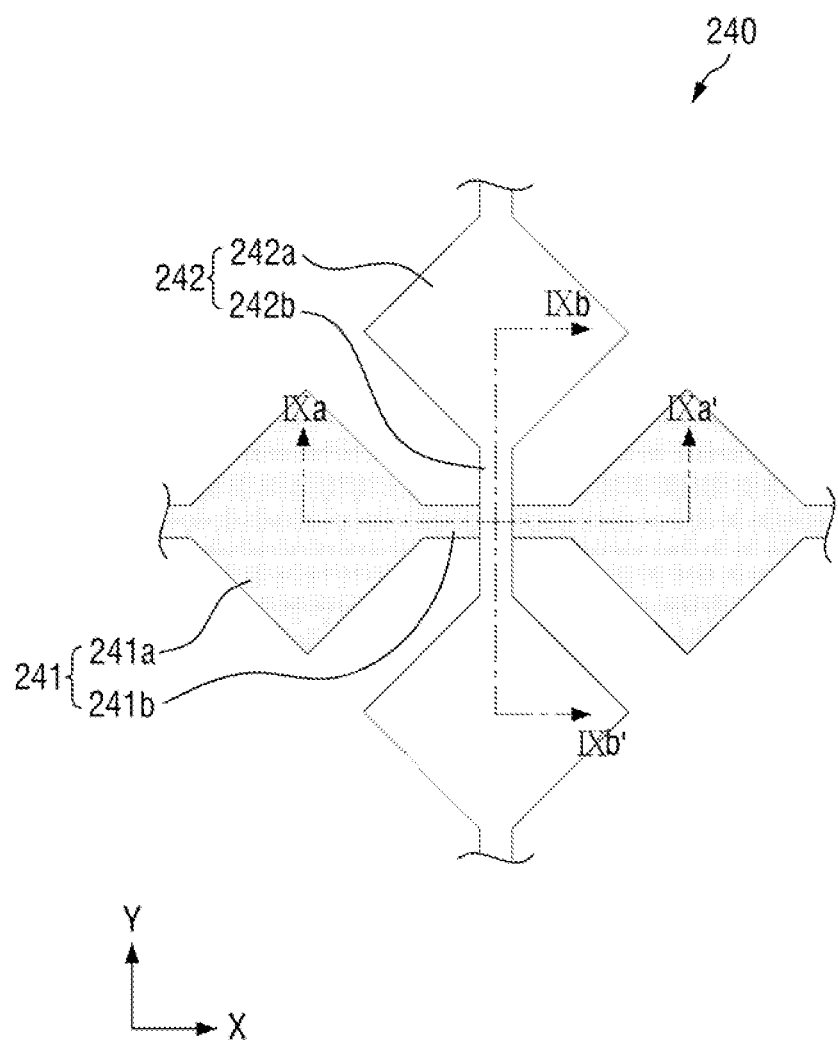
FIG. 8 is an enlarged view illustrating a first touch electrode and a second touch electrode of FIG. 7.
Figure 9:
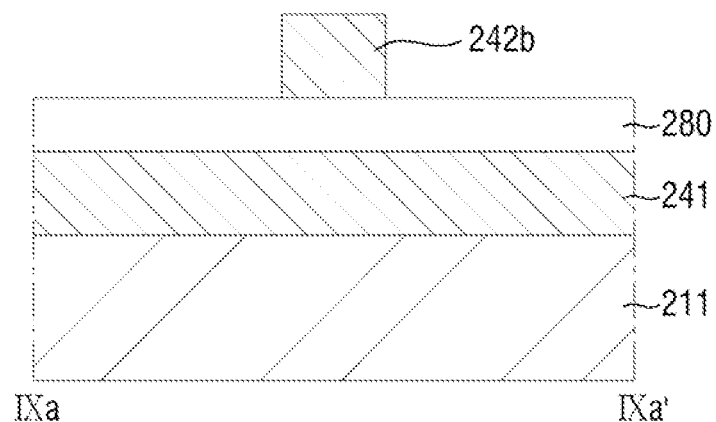
FIG. 9 is a comparative cross-sectional view illustrating a cross-sectional taken along the line IXa-Ixa' of FIG. 8 and a cross-sectional taken along the line IXb-Ixb' of FIG. 8.
Figure 9:
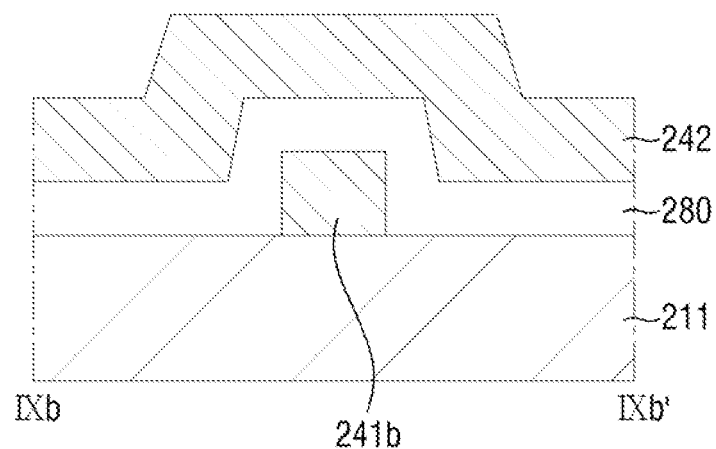

FIG. 6 is a plan view illustrating a touch element layer 231 of the counter substrate 201 of FIG. 1. FIG. 7 is an enlarged view of the area A in FIG. 6. FIG. 8 is an enlarged view illustrating a first touch electrode 241 and a second touch electrode 242 of FIG. 7. FIG. 9 is a comparative cross-sectional view illustrating a cross-sectional taken along the line IXa-Ixa' of FIG. 8 and a cross-sectional taken along the line IXb-Ixb' of FIG. 8.

Referring to FIGS. 6 to 9, a touch element layer 230 including a touch electrode layer 240, touch wirings 251, and a touch pad unit 271 may be disposed on the upper surface of the second base substrate 211.

The touch electrode layer 240 may include a first touch electrode 241 extending in the first direction X and a second touch electrode 242 extending in the second direction Y. The first touch electrode 241 and the second touch electrode 242 may cross each other. A fourth insulating layer 280 may be interposed between the first touch electrode 241 and the second touch electrode 242 to insulate them from each other. The fourth insulating layer 280 may include an inorganic insulating material. Examples of the inorganic insulating material include silicon nitride, silicon oxide, silicon oxynitride, and silicon oxynitride.

The plurality of first touch electrodes 241 may extend in the first direction X, and may be spaced apart from each other in the second direction Y. The first touch electrode 241 may be a transparent electrode. The first touch electrode 241 may include a plurality of first extension portions 241a having a substantially rhombic shape in a plan view and a first connection portion 241b connecting the adjacent first extension portions 241a. The first touch electrode 241 may be a sensing electrode configured to carry a sensing signal.

The plurality of second touch electrodes 242 may extend in the second direction Y, and may be spaced apart from each other in the first direction X. The second touch electrode 242 may be a transparent electrode. The second touch electrode 242 may include a plurality of second extension portions 242a having a substantially rhombic shape in a plan view and a second connection portion 242b connecting the adjacent second extension portions 242a. The second touch electrode 242 may be a driving electrode configured to carry a driving signal.

In an exemplary embodiment of the present invention in which each of the first extension portions 241a and the second extension portion 242a has a rhombic shape, the first extending portion 241a and the second extending portion 242a may be spaced apart from each other in a direction facing each other (for example, a diagonal direction intersecting the first direction X and the second direction Y in the plane). The first connection portion 241b and the second connection portion 242b may intersect each other so as to be insulated from each other. For example, the second connection portion 242b extending in the second direction Y may be disposed on the first connection portion 241b extending in the first direction X, and the fourth insulating layer 280 may be interposed between the first connection portion 241b and the second connection portion 242b.

A mutual capacitance may be formed between the first touch electrode 241 extending in the first direction X and the second touch electrode 242 extending in the second direction Y. When the capacitance between the first touch electrode 241 and the second touch electrode 242 is changed by a user's touch operation, the display device 1 can acquire coordinate information about the user's touch operation based on the changed capacitance. For example, the touch element layer 231 of the counter substrate 201 can acquire the coordinate information about the user's touch operation.

The touch wirings 251 may extend from the non-display area NA, for example, the inner non-display area INA, and may transmit a signal provided from an external driving element to the touch electrode layer 240. For example, the touch wirings 251 may be electrically connected to the touch pad unit 271 to transmit a signal provided from the second flexible circuit film 501 to the touch electrode layer 240. The touch wirings 251 may include a first touch wiring 251a connected with the first touch electrode 241 and a second touch wiring 251b connected with the second touch electrode 242.

The first touch wiring 251a may include first portions 251a1 extending in the first direction X and second portions 251a2 extending in the second direction Y. The second touch wiring 251b may include first portions 251b1 extending in the first direction X and second portions 251b2 extending in the second direction Y. In an exemplary embodiment of the present invention, each of the first touch wiring 251a and the second touch wiring 251b may be located at least partially in the non-display area NA. For example, in a plan view, the first portion 251b1 of the second touch wiring 251b may be located entirely within the sealing member 301.

The touch pad unit 271 (for example, the second pad unit) may be located in the non-display area NA. For example, the touch pad unit 271 may be located at least partially in the outer non-display area ONA. For example, the touch pad unit 271 may at least partially overlap the outer non-display area ONA without being located in the inner non-display area, and may at least partially overlap the sealing area SA. In this case, the touch wirings 251 may at least partially cross the sealing area SA. The planar area occupied by the inner non-display area INA can be minimized by disposing the touch pad unit 271 so as not to be located in the inner non-display area INA.

The touch pad unit 271 may include first pad electrodes 271a connected to the first touch wiring 251a and second pad electrodes 271b connected to the second touch wiring 251b. However, the present invention is not limited thereto, and in an exemplary embodiment of the present invention, the ends of the first touch wiring 251a and the second touch wiring 251b may extend to form the touch pad unit 271 for electrical connection.

The present invention is not limited thereto. For example, when the light-emitting substrate 101 including the light-emitting element 190 and the counter substrate 201 including the touch element layer 231 are respectively manufactured, and then coupled with each other using the sealing member 301, the touch wiring portions 251a1 and 251b1 extending in the first direction X adjacent to the sealing member 301 extending in the first direction X and the touch wiring portions 251a2 and 251b2 extending in the second direction Y adjacent to the sealing member 301 extending in the second direction Y were disposed inward from the sealing member 301, so as to secure the transmittance of a laser traveling from the counter substrate 201 to the sealing member 301 and to cure the sealing member with the laser.

The touch pad unit 271 may be disposed adjacent to one side edge of the second base substrate 211 in the second direction Y. In an exemplary embodiment of the present invention, the touch pad unit 271 including the first pad electrode 271a and the second pad electrode 271b is disposed adjacent to the fourth edge 221b of the second base substrate 211, but might not be disposed adjacent to the fifth edge 221a and the sixth edge 221c. The touch pad unit 271 including the first pad electrode 271a and the second pad electrode 271b is disposed on the first protruding portion 211b of the second base substrate 211, but might not be disposed on the main portion 211a and the second protruding portion 211c, thereby simplifying the connection structure of the second flexible circuit film 501 and minimizing the area of the non-display area NA. In addition, there is an effect of securing a space for disposing a module member 601 to be described later.

Hereinafter, the sealing member 301 of the display device 1 according to exemplary embodiments of the present invention will be described in detail with reference to FIG. 10.

Figure 10:
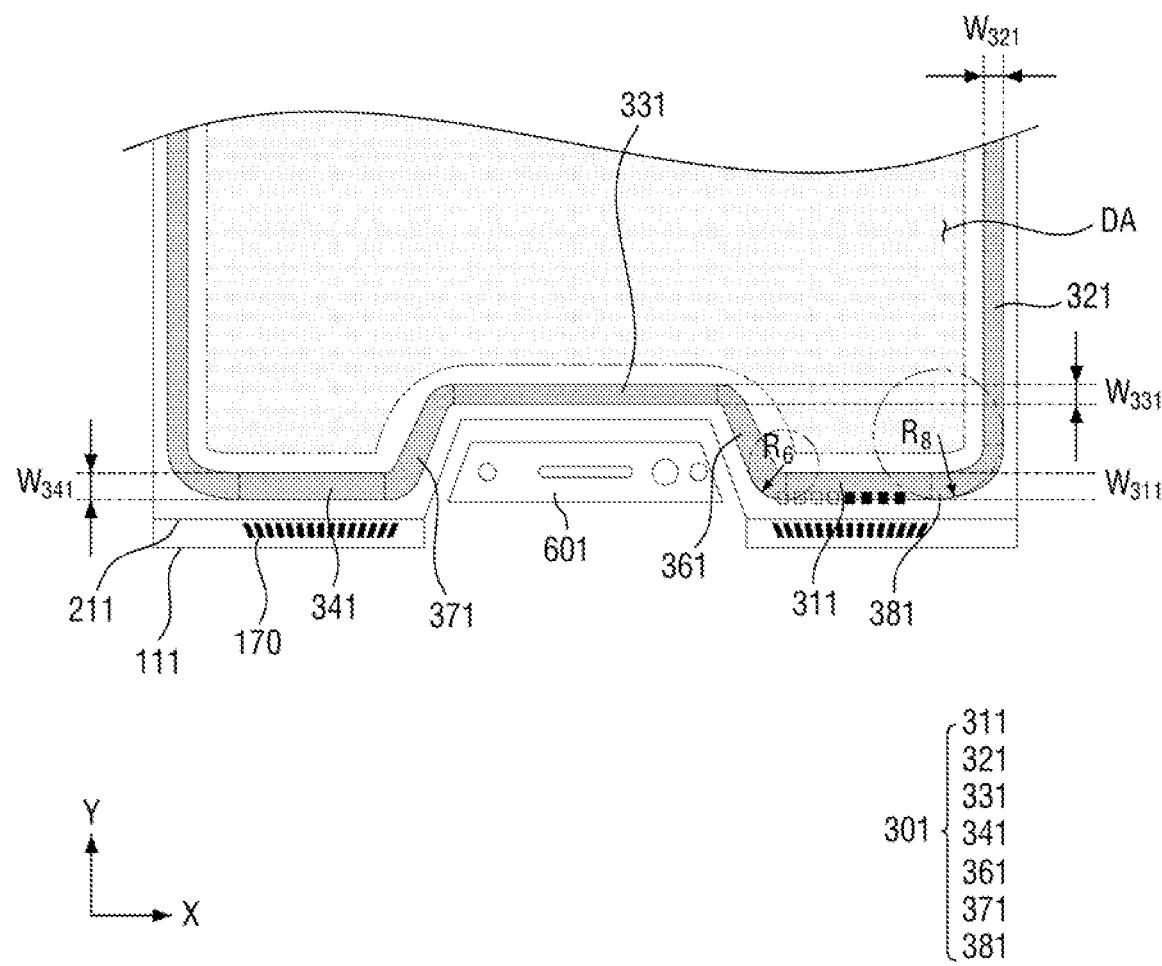
FIG. 10 is a layout view illustrating the light-emitting substrate, the counter substrate, and the sealing member of FIG. 1.

FIG. 10 is a layout view illustrating the light-emitting substrate 101, the counter substrate 201, and the sealing member 301 of FIG. 1.

Referring to FIG. 10, the sealing member 301 may be disposed between the light-emitting substrate 101 and the counter substrate 201 to couple them with each other. For example, the sealing member 301 may be brought into contact with the interlayer insulating layer 160 of the light-emitting substrate 101 and the back surface of the second base substrate 211 of the counter substrate 201. The sealing member 301 may be a cured frit. As used herein, the term "frit" refers to a structure having glass properties formed by melt-curing a powdered glass optionally containing an additive.

In a plan view, the sealing member 301 may form a closed curve and may surround the light-emitting element 190 of the light-emitting substrate 101. For example, the sealing member 301 is configured to seal the light emitting element 190, and thus can prevent the light emitting element 190 from being damaged by air, moisture, or the like. The sealing member 301 may be disposed in the non-display area NA to define the sealing area SA. The planar shape of the sealing member 301 may have a shape substantially corresponding to the planar shape of the first base substrate 111 or the planar shape of the second base substrate 211.

In an exemplary embodiment of the present invention, the sealing member 301 may include a first linear portion 311 extending in the first direction X and a second linear portion 321 extending in the second direction Y.

The first linear portion 311 may have a substantially linear shape. For example, each of the outer edge and the inner edge of the first linear portion 311 of the sealing member 301 may have a substantially linear shape extending in the first direction X. The first linear portion 311 may overlap the first protruding portion 111b of the first base substrate 111 and the first protruding portion 211b of the second base substrate 211. The first linear portion 311 may be a part of the sealing member 301 closest to the first edge 121b of the first base substrate 111 and the fourth edge 221b of the second base substrate 211.

The second linear portion 321 may have a substantially linear shape. For example, each of the outer edge and the inner edge of the second linear portion 321 of the sealing member 301 may have a substantially linear shape extending in the second direction Y. The second linear portion 321 may overlap the main portion 111a of the first base substrate 111 and the main portion 211a of the second base substrate 211. Further, the second linear portion 321 may at least partially overlap the first protruding portion 111b of the first base substrate 111 and the first protruding portion 211b of the second base substrate 211.

The maximum width $W_{311}$ of the first linear portion 311 may be different from the maximum width $W_{321}$ of the second linear portion 321. In an exemplary embodiment of the present invention, the maximum width $W_{311}$ of the first linear portion 311 may be greater than the maximum width $W_{321}$ of the second linear portion 321. For example, the maximum width $W_{311}$ of a portion of the sealing member 301 overlapping the first protruding portion 111b of the first base substrate 111 and the first protruding portion 211b of the second base substrate 211 (for example, the first linear portion 311) may be greater than the maximum width $W_{321}$ of a portion of the sealing member 301 overlapping the main portion 111a of the first base substrate 111 and the main portion 211a of the second base substrate 211 (for example, the second linear portion 321).

The difference between the maximum width $W_{311}$ of the first linear portion 311 and the maximum width $W_{321}$ of the second linear portion 321 may be about 10% or more of the maximum width $W_{321}$ of the second linear portion 321. For example, the maximum width $W_{321}$ of the second linear portion 321 may be within a range of about 400 μm to about 450 μm, and the maximum width $W_{311}$ of the first linear portion 311 may be within a range of about 450 μm to about 550 μm. As used herein, unless otherwise defined, the term "width" refers to a width in a direction perpendicular to an extension direction or a protruding direction. Therefore, width may be thought of here as the line thickness of the first linear portion 311, the second linear portion 321, and the third linear portion 331, as shown in FIG. 10.

The first linear portion 311 may be located adjacent to the light-emitting substrate pad unit 170 and the touch pad unit 271. In a plan view, the first linear portion 311 may be located between the light-emitting substrate pad unit 170 and the touch pad unit 271. The present invention is not limited thereto, but, for example, when the light-emitting substrate pad unit 170 and the first flexible circuit film 401 are connected through a pressing process and/or the touch pad unit 271 and the second flexible circuit film 501 are connected through a pressing process, stress caused by the pressing process may be focused on the first protruding portion 111b of the first base substrate 111, the first protruding portion 211b of the second base substrate 211 and the first linear portion 311 of the sealing member 301. In addition, the light-emitting substrate pad unit 170 is not formed on the main portion 111a of the first base substrate 111, so that the pressure per unit area applied to the first protruding portion 111b of the first base substrate 111 in the pressing process may increase. In the display device 1, according to exemplary embodiments of the present invention, the maximum width $W_{311}$ of the first linear portion 311, which is relatively vulnerable to stress, is sufficiently wide, so that the durability of the display device 1 can be increased. The touch pad unit 271 and the touch wirings 251 of the aforementioned touch element layer 231 may at least partially overlap the first linear portion 311.

In some exemplary embodiments of the present invention, the sealing member 301 may further include a first curved portion 361 extending from the first linear portion 311 and partially curved, and a third linear portion 331 extending from the first curved portion 361 and extending in the first direction X.

In a plan view, the first curved portion 361 may include one or more curved portions. The first curved portion 361 may have a partially curved shape including at least one curved line having a predetermined curvature radius $R_6$. For example, the first curved portion 361 may be an assembly of curves having different curvature radii.

The first curved portion 361 may include a portion concavely curved toward the display area DA (for example, a portion directly contacting the first linear portion 311) and a portion convexly curved toward the display area DA (for example, a portion directly contacting the third linear portion 331). As used herein, the term "curved portion" includes not only a case where the outer edge and the inner edge of the sealing member are formed entirely within a curved line but also a case where the outer edge and the inner edge of the sealing member has a partially linear section together with a curved section. For example, the present invention is not limited thereto, but there may be a partially straight portion between the concavely curved portion and the convexly curved portion of the first curved portion 361.

The first curved portion 361 may overlap the first protruding portion 111b of the first base substrate 111 and the first protruding portion 211b of the second base substrate 211. Further, the first curved portion 361 may at least partially overlap the main portion 111a of the first base substrate 111 and the main portion 211a of the second base substrate 211.

The third linear portion 331 may have a substantially linear shape. For example, each of the outer edge and the inner edge of the third linear portion 331 of the sealing member 301 may have a substantially linear shape extending in the first direction X. The third linear portion 331 may overlap the main portion 111a of the first base substrate 111 and the main portion 211a of the second base substrate 211. The third linear portion 331 may be a part of the sealing member 301 closest to the second edge 121a of the first base substrate 111 and the fifth edge 221a of the second base substrate 211.

The maximum width $W_{331}$ of the third linear portion 331 may be different from the maximum width $W_{311}$ of the first linear portion 311. In an exemplary embodiment of the present invention, the maximum width $W_{311}$ of the first linear portion 311 may be greater than the maximum width $W_{331}$ of the third linear portion 331. As described above, the maximum width $W_{311}$ of the first linear portion 311, which is relatively vulnerable to stress, is formed to be wider than that of other portions, so that the durability of the display device 1 can be increased, and the shortest distance $D_2$ from the second edge 121a to the display area DA and the shortest distance $D_5$ from the fifth edge 221a to the display area DA can be minimized. The maximum width $W_{331}$ of the third linear portion 331 may be the same as or different from the maximum width $W_{321}$ of the second linear portion 321.

In an exemplary embodiment of the present invention in which the maximum width $W_{331}$ of the third linear portion 331 is smaller than the maximum width $W_{311}$ of the first linear portion 311, the width of the first curved portion 361 may decrease from the first linear portion 311 toward the third linear portion 331. For example, the width of the first curved portion 361 may gradually decrease.

In some exemplary embodiments of the present invention, the sealing member 301 may further include a second curved portion 371 extending from the third linear portion 331 and partially curved, and a fourth linear portion 341 extending from the second curved portion 371 and extending in the first direction X.

For example, the second curved portion 371 may include a portion concavely curved toward the display area DA (for example, a portion contacting the fourth linear portion 341) and a portion convexly curved toward the display area DA (for example, a portion contacting the third linear portion 331). The second curved portion 371 may overlap the second protruding portion 111c of the first base substrate 111 and the second protruding portion 211c of the second base substrate 211. Further, the second curved portion 371 may at least partially overlap the main portion 111a of the first base substrate 111 and the main portion 211a of the second base substrate 211.

The fourth linear portion 341 may have a substantially linear shape. For example, each of the outer edge and the inner edge of the fourth linear portion 341 of the sealing member 301 may have a substantially linear shape extending in the first direction X. The fourth linear portion 341 may overlap the second protruding portion 111c of the first base substrate 111 and the second protruding portion 211c of the second base substrate 211.

The maximum width $W_{341}$ of the fourth linear portion 341 may be different from the maximum width $W_{321}$ of the second linear portion 321. In an exemplary embodiment of the present invention, the maximum width $W_{341}$ of the fourth linear portion 341 may be greater than the maximum width $W_{321}$ of the second linear portion 321. For example, the maximum width $W_{321}$ of the second linear portion 321 may be within a range of about 400 μm to about 450 μm, and the maximum width $W_{341}$ of the fourth linear portion 341 may be within a range of about 450 μm to about 550 μm.

In some exemplary embodiments of the present invention, the sealing member 301 may further include a third curved portion 381 disposed between the first linear portion 311 and the second linear portion 321 to connect the first linear portion 311 and the second linear portion 321 and partially curved.

In a plan view, the third curved portion 381 may include one or more curved portions. The third curved portion 381 may have a partially curved shape including at least one curved line having a predetermined curvature radius $R_8$. For example, the third curved portion 381 may be an assembly of curves having different curvature radii.

The third curved portion 381 may include a portion curved concavely toward the display area DA, but might not include a portion convexly curved toward the display area DA. The third curved portion 381 may overlap the first protruding portion 111b of the first base substrate 111 and the first protruding portion 211b of the second base substrate 211.

In a non-limiting example, the maximum radius curvature $R_8$ formed by the third curved portion 381 (for example, the curvature radius of a curve having the maximum curvature radius when the third curved portion 381 is an assembly of curves having different curvature radii from each other) may be greater than the maximum radius curvature $R_6$ formed by the first curved portion 361 (for example, the curvature radius of a curve having the maximum curvature radius when the first curved portion 361 is an assembly of curves having different curvature radii from each other).

As described above, the first curved portion 361 may be located at the bay formed by the edges 121 and 221 of the first base substrate 111 and the second base substrate 211 in the second direction Y, and the third curved portion 381 may be located at the edge of the first base substrate 111 and the second base substrate 211 in the first direction X. The present invention is not limited thereto, but when one side edge 121 of the first base substrate 111 in the second direction Y is partially indented and one side edge 221 of the second base substrate 211 in the second direction Y is partially indented, the external impact applied to the display device 1 may be concentrated/focused in the vicinity of the indented portion. For example, the external impact applied to the display device 1 may be concentrated/focused in the vicinity of the first curved portion 361 as compared with the vicinity of the third curved portion 381. In the display device 1, according to exemplary embodiments of the present invention, the maximum curvature radius $R_6$ of the first curved portion 361, which is relatively vulnerable to stress, is smaller than the maximum curvature radius $R_8$ of the third curved portion 381, so that the durability of the display device 1 can be increased.

Meanwhile, the display device 1 may further include a first flexible circuit film 401, a second flexible circuit film 501, and a module member 601.

The light-emitting substrate pad unit 170 of the light-emitting substrate 101 may be connected to the first flexible circuit film 401, and the touch pad unit 271 of the counter substrate 201 may be connected to the second flexible circuit film 501. Although FIG. 2 illustrates that the light-emitting substrate pad unit 170 is connected to the first flexible circuit film 401 through a first anisotropic conductive film 490 and the touch pad unit 271 is connected to the second flexible circuit film 501 through a second anisotropic conductive film 590, the present invention is not limited thereto. Although FIG. 1 shows a state in which the first flexible circuit film 401 and the second flexible circuit film 501 are unfolded without being curved, for convenience of explanation, each of the first flexible circuit film 401 and the second flexible circuit film 501 may be curved toward the back side of the light emitting substrate 101.

The first flexible circuit film 401 may be curved in the second direction Y with flexibility. The first flexible circuit film 401 may include a first base film 411 having insulation properties, conductive patterns disposed on the first base film 411, and a driving IC 431. In an exemplary embodiment of the present invention, the first flexible circuit film 401 may be a flexible printed circuit board (FPCB). However, the present invention is not limited thereto. In an exemplary embodiment of the present invention, the first flexible circuit film 401 includes a chip-on-film package, and the chip-on-film package may be connected to a separate printed circuit board.

The second flexible circuit film 501 may be curved in the second direction Y with flexibility. The second flexible circuit film 501 may include a second base film 511 having insulation properties and conductive patterns disposed on the second base film 511. In some exemplary embodiments of the present invention, the second flexible circuit film 501 further includes a second connector 551, and the second connector 551 of the second flexible circuit film 501 may be connected to the first connector 451 of the first flexible circuit film 401.

The module member 601 may be configured to have an optical sensing function and/or a speaker function. For example, the module member 601 may include a sensor module such as a camera sensor for acquiring image information, a luminance sensor for acquiring brightness information on the front surface of the display device 1, and/or a proximity sensor for acquiring information about a distance to an adjacent object or acquiring information about a position of the adjacent object, or may be a speaker module for acoustically modulating electrical signals.

The module member 601 may be disposed at one side (for example, a lower side in FIG. 10) of the first base substrate 111 and the second base substrate 211 in the second direction Y. For example, the module member 601 may be disposed adjacent to the second edge 121a of the main portion 111a of the first base substrate 111 and the fifth edge 221a of the main portion 211a of the second base substrate 211. Further, the module member 601 may be disposed between the first protruding portion 111b and the second protruding portion 111c of the first base substrate 111 and between the first protruding portion 211b and the second protruding portion 211c of the second base substrate 211. For example, the module member 601 may be disposed between the first curved portion 361 and the second curved portion 371 of the sealing member 301.

Hereinafter, the module member 601 and the first flexible circuit film 401 of the display device 1, according to exemplary embodiments of the present invention, will be described in detail with reference to FIGS. 11 to 13.

Figure 11:
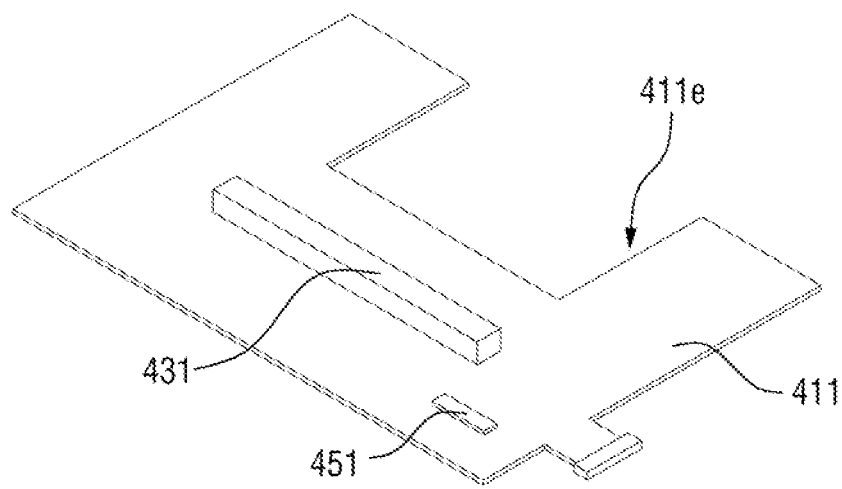
FIG. 11 is a perspective view illustrating the first flexible circuit film of FIG. 1.

FIG. 11 is a perspective view illustrating the first flexible circuit film 401 of FIG. 1. FIG. 12 is a perspective view showing the layout of the module member 601 and the first flexible circuit film 401 of FIG. 1. FIG. 13 is a rear perspective view illustrating the module member 601 and the first flexible circuit film 401 of FIG. 12.

Figure 12:
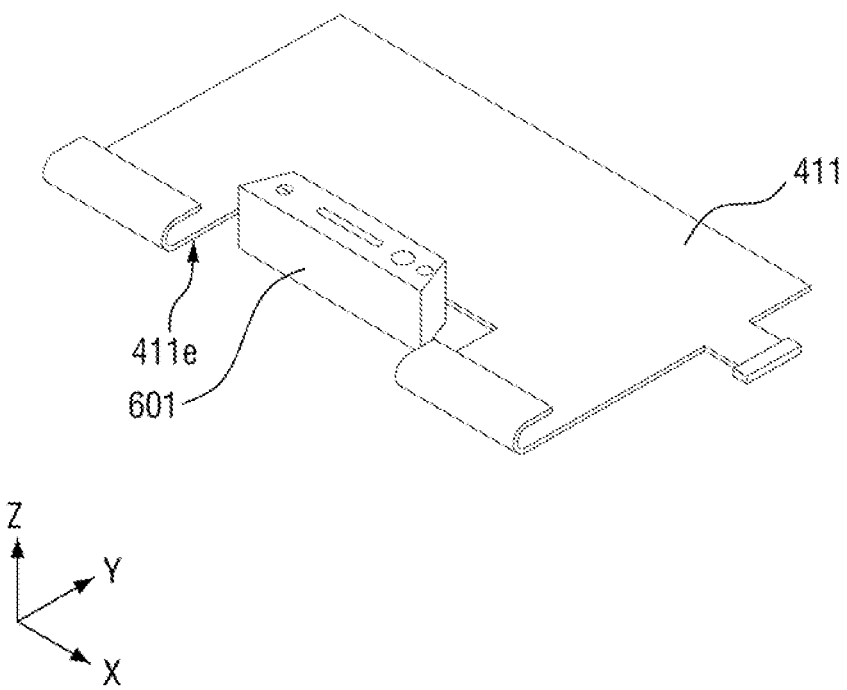
FIG. 12 is a perspective view illustrating the layout of the module member and the first flexible circuit film of FIG. 1.
Figure 13:
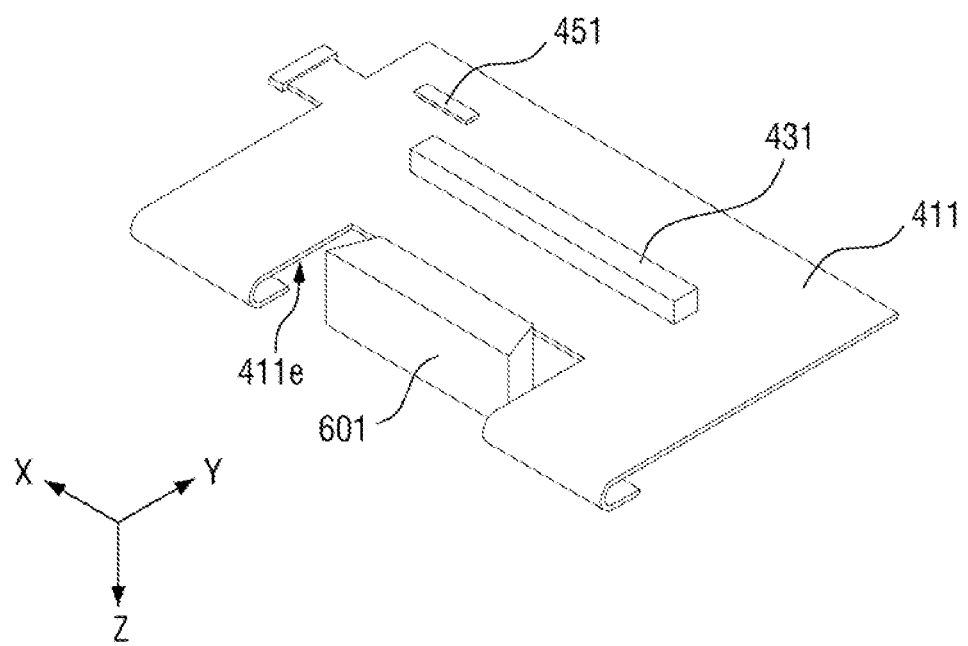
FIG. 13 is a rear perspective view illustrating the module member and the first flexible circuit film of FIG. 12.

Referring to FIGS. 11 to 13, one side edge 411e of the first flexible circuit film 411 in the second direction Y may have a partially indented shape. For example, the first flexible circuit film 411 may have a bay, notch, or trench shape in a plan view.

In an exemplary embodiment of the present invention, with the first flexible circuit film 411 curved, at least a part of the module member 601 may be located inside a bay of the first flexible circuit film 411. For example, in a plan view, the module member 601 may be located inside the bay of the first flexible circuit film 411.

As described above, in the display device 1 according to an exemplary embodiment of the present invention, the display area DA having a partially indented edge is formed, and the module member 601 is disposed in the indented portion, thereby minimizing the planar area of the non-display area NDA. The present invention is not limited thereto, but even when the module member 601 is relatively thick, the edge 411e of the first flexible circuit film 411 curved toward the rear surface of the light-emitting substrate 101 is partially indented, so that the module member 601 and the first flexible circuit film 411 can be disposed so as not to overlap each other in the third direction Z, and the slimming of the display device 1 can be achieved.

Hereinafter, exemplary embodiments of the present invention will be described. However, to the extent that a description of an element is omitted, it may be assumed that the omitted description is at least similar to that of corresponding elements that have already been described.

Figure 14:
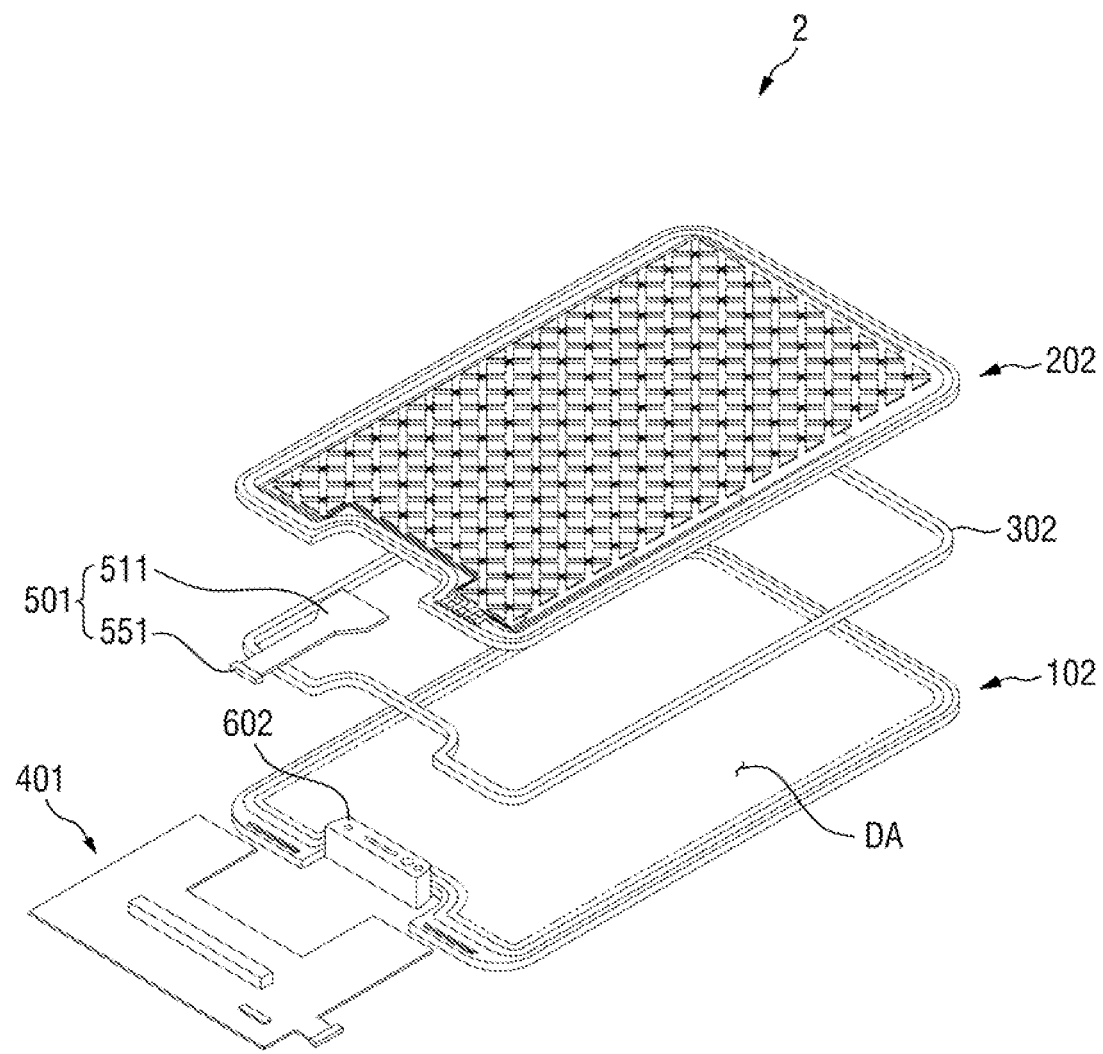
FIG. 14 is an exploded perspective view illustrating a display device according to an exemplary embodiment of the present invention.
Figure 15:
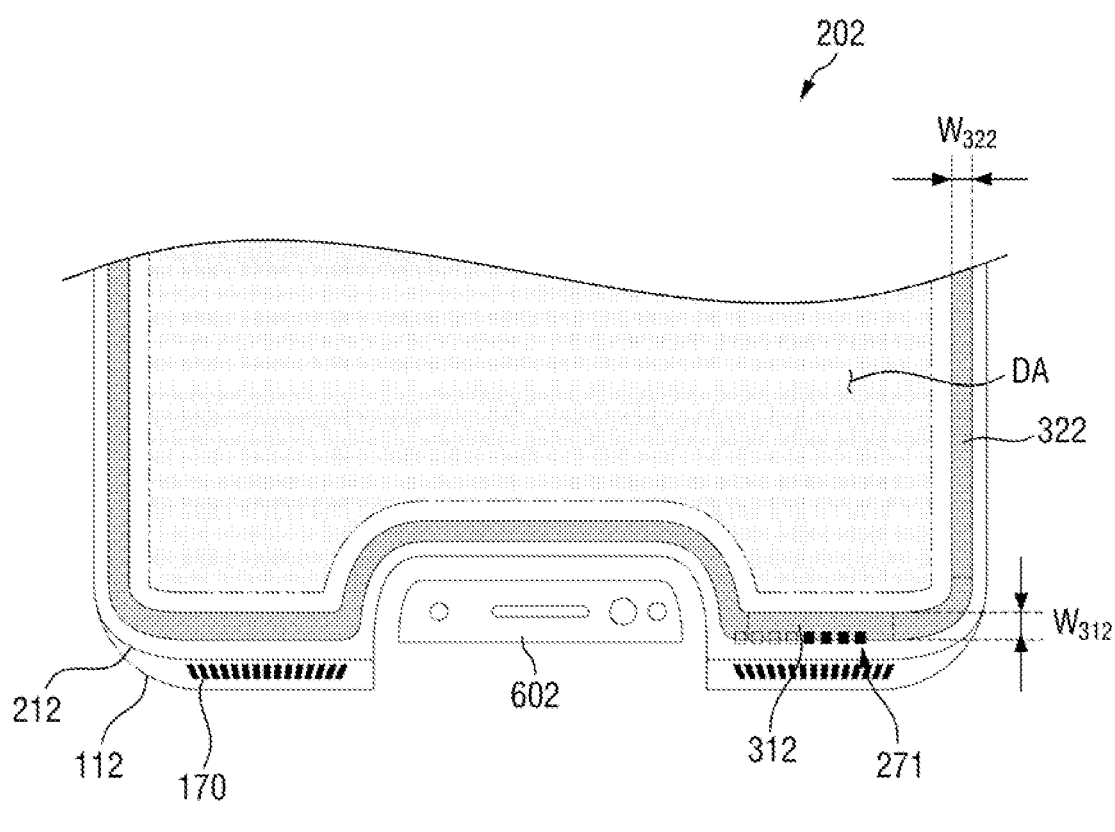
FIG. 15 is a layout view illustrating the light-emitting substrate, the counter substrate, and the sealing member of FIG. 14.

FIG. 14 is an exploded perspective view illustrating a display device 2 according to an exemplary embodiment of the present invention. FIG. 15 is a layout view illustrating a light-emitting substrate 101, a counter substrate 202, and a sealing member 302 of FIG. 14.

Referring to FIGS. 14 and 15, the display device 2, according to exemplary embodiments of the present invention, is different from the display device 1 described above with respect to FIG. 1 and the like in that each of the light-emitting substrate 102 and the counter substrate 202 has rounded apexes.

One side edge (for example, a lower edge in FIG. 15) of a first base substrate 112 in the second direction Y may have an atypical shape such as a bay, a notch, or a trench, in a plan view. For example, one side edge of the first base substrate 112 may be partially indented. For example, the first base substrate 112 may include a main portion, a first protruding portion (for example, a right protruding portion in FIG. 15) protruding from the main portion in the second direction Y, and a second protruding portion (for example, a left protruding portion in FIG. 15) protruding from the main portion in the second direction Y and spaced apart from the first protruding portion in the first direction X. Since the main portion, the first protruding portion and the second protruding portion of the first base substrate 112 having the indented edge have been described in detail with reference to FIG. 4 and the like, a duplicate description will be omitted.

In an exemplary embodiment of the present invention, the edges of the first protruding portion and the second protruding portion of the first base substrate 112 may be at least partially rounded. For example, the apexes of the first protruding portion and the second protruding portion of the first base substrate 112 may have a round shape.

Further, one side edge (for example, a lower edge in FIG. 15) of a second base substrate 212 in the second direction Y may have an atypical shape such as a bay, a notch, or a trench, in a plan view. For example, one side edge of the second base substrate 212 may be partially indented. For example, the second base substrate 212 may include a main portion, a first protruding portion (for example, a right protruding portion in FIG. 15) protruding from the main portion in the second direction Y, and a second protruding portion (for example, a left protruding portion in FIG. 15) protruding from the main portion in the second direction Y and spaced apart from the first protruding portion in the first direction X. The planar area of the second base substrate 212 may be smaller than the planar area of the first base substrate 112, and the lower edge of the second base substrate 212 may be located above the lower edge of the first base substrate 112 in a plan view. Since the main portion, the first protruding portion and the second protruding portion of the second base substrate 212 having the indented edge have been described in detail with reference to FIG. 5 and the like, duplicate descriptions will be omitted.

In an exemplary embodiment of the present invention, the edges of the first protruding portion and the second protruding portion of the second base substrate 212 may be at least partially rounded. For example, the apexes of the first protruding portion and the second protruding portion of the second base substrate 212 may have a round shape.

As described above, the light-emitting substrate pad unit 170 may be located between the edge of the first base substrate 112 and the edge of the second base substrate 212 in a plan view.

The sealing member 302 may be disposed between the light emitting substrate 102 and the counter substrate 202 so as to couple the light emitting substrate 102 to the counter substrate 202. In a plan view, the sealing member 302 may be located in the non-display area (for example, a sealing area) surrounding the display area DA, and may form a closed curve. The planar shape of the sealing member 302 may have a shape substantially corresponding to the planar shape of the first base substrate 112 or the planar shape of the second base substrate 212. In an exemplary embodiment of the present invention, the maximum width $W_{312}$ of the first linear portion 312 extending in the first direction X of the sealing member 302 in the second direction Y is greater than the maximum width $W_{312}$ of the second linear portion 322 extending in the second direction Y of the sealing member 302 in the first direction X.

As described above, the touch pad unit 271 may at least partially overlap the sealing member 302 in a plan view.

A module member 602 may have an optical sensing function and/or a speaker function. The module member 602 may be disposed at one side of the first base substrate 112 and the second base substrate 212 in the second direction Y. For example, the module member 602 may be disposed at the indented portion of the first base substrate 112 and the second base substrate 212. For example, the module member 602 may be disposed between the first protruding portion and the second protruding portion of the first base substrate 112 and between the first protruding portion and the second protruding portion of the second base substrate 212. The planar shape of the module member 602 may be a shape substantially corresponding to a shape in which one side edges of the first base substrate 112 and the second base substrate 212 are indented.

Since other configurations of the display device 2 according to this embodiment have been described above with reference to FIG. 1 and the like, duplicate descriptions thereof will be omitted.

Figure 16:
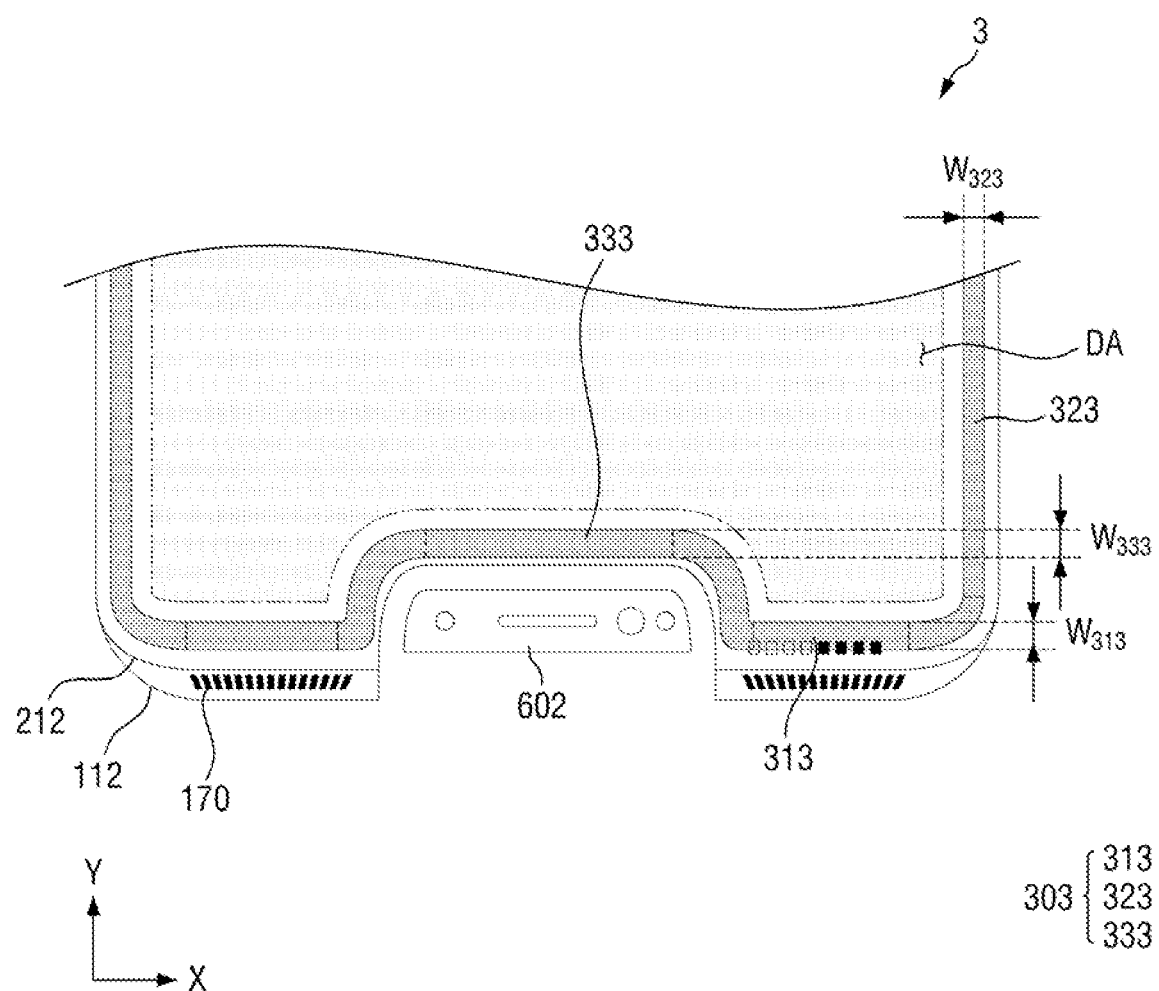
FIG. 16 is a layout view illustrating a light-emitting substrate, a counter substrate, and a sealing member of a display device according to an exemplary embodiment of the present invention.

FIG. 16 is a layout view illustrating a light-emitting substrate, a counter substrate, and a sealing member 303 of a display device 3 according to an exemplary embodiment of the present invention.

Referring to FIG. 16, the display device 3, according to an exemplary embodiment of the present invention, is different from the display device 2 of FIG. 14 and the like in that the sealing member 303 includes a first linear portion 313, a second linear portion 323, and a third linear portion 333, but the maximum width $W_{333}$ of the third linear portion 333 is greater than the maximum width $W_{323}$ of the second linear portion 323.

The sealing member 303 includes a first linear portion 313 extending in the first direction X, a second linear portion 323 extending in the second direction Y, and a third linear portion 333 extending in the first direction X.

The first linear portion 313 may have a substantially linear shape. The first linear portion 313 may overlap the first protruding portion of the first base substrate 112 and the first protruding portion of the second base substrate 212.

The second linear portion 323 may have a substantially linear shape. The second linear portion 323 may overlap the main portion of the first base substrate 112 and the main portion of the second base substrate 212. Further, the second linear portion 323 may at least partially overlap a first protruding portion (for example, a right protruding portion of FIG. 16) of the first base substrate 112 and a first protruding portion (for example, a right protruding portion of FIG. 16) of the second base substrate 212.

The maximum width $W_{313}$ of the first linear portion 313 may be greater than the maximum width $W_{323}$ of the second linear portion 323. For example, the maximum width $W_{323}$ of the second linear portion 323 may be within a range of about 400 μm to about 450 μm, and the maximum width $W_{313}$ of the first linear portion 313 may be within a range of about 450 μm to about 550 μm.

The third linear portion 333 may have a substantially linear shape. The third linear portion 333 may overlap the main portion of the first base substrate 112 and the main portion of the second base substrate 212.

The maximum width $W_{333}$ of the third linear portion 333 may be different from the maximum width $W_{323}$ of the second linear portion 323. In an exemplary embodiment of the present invention, the maximum width $W_{333}$ of the third linear portion 333 may be greater than the maximum width $W_{323}$ of the second linear portion 323. The difference between the maximum width $W_{333}$ of the third linear portion 333 and the maximum width $W_{323}$ of the second linear portion 323 may be about 10% or more of the maximum width $W_{323}$ of the second linear portion 323. For example, the maximum width $W_{333}$ of the third linear portion 333 may be within a range of about 400 μm to about 450 μm. The maximum width $W_{333}$ of the third linear portion 333 may be the same as or different from the maximum width $W_{313}$ of the first linear portion 313.

The third linear portion 333 may be located at the bay formed by the edges of the first base substrate 112 and the second base substrate 212 in the second direction Y, and the second linear portion 323 may be located at the edge of the first base substrate 112 and the second base substrate 212 in the first direction X. The present invention is not limited thereto, but when one side edge of the first base substrate 112 in the second direction Y is partially indented and one side edge of the second base substrate 212 in the second direction Y is partially indented, the external impact applied to the display device 3 may be concentrated/focused in the vicinity of the indented portion. For example, the external impact applied to the display device 3 may be concentrated/focused in the vicinity of the third linear portion 333 as compared with the vicinity of the second linear portion 323. In the display device 3, according to an exemplary embodiment of the present invention, the maximum width $W_{333}$ of the third linear portion 333, which is relatively vulnerable to stress, is wider than the maximum width $W_{323}$ of the second linear portion 323, so that the durability of the display device 3 can be increased.

Since other configurations of the display device 3 according to this embodiment have been described above with reference to FIG. 1, FIG. 14, and the like, duplicate descriptions thereof will be omitted.

Figure 17:
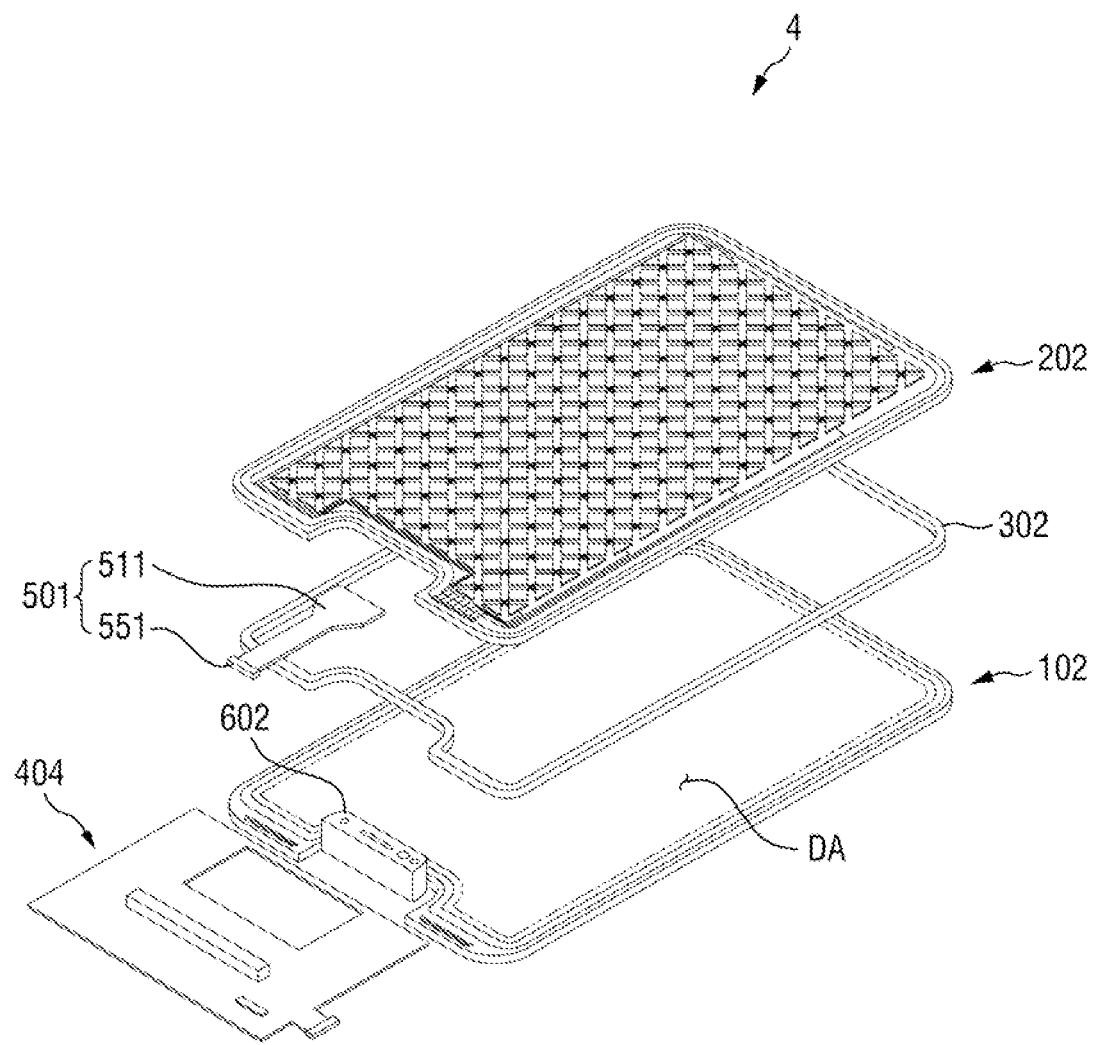
FIG. 17 is an exploded perspective view illustrating a display device according to an exemplary embodiment of the present invention.
Figure 18:
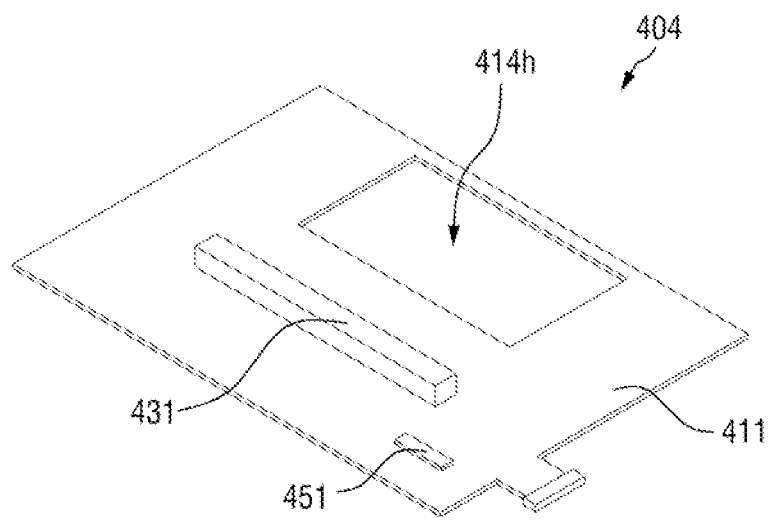
FIG. 18 is a perspective view illustrating the first flexible circuit film of FIG. 17.
Figure 19:
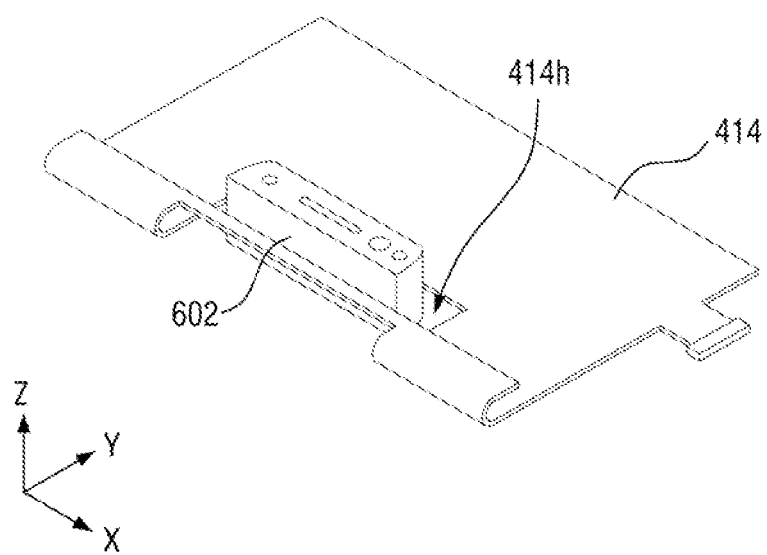
FIG. 19 is a perspective view illustrating the layout of the module member and the first flexible circuit film of FIG. 17.
Figure 20:
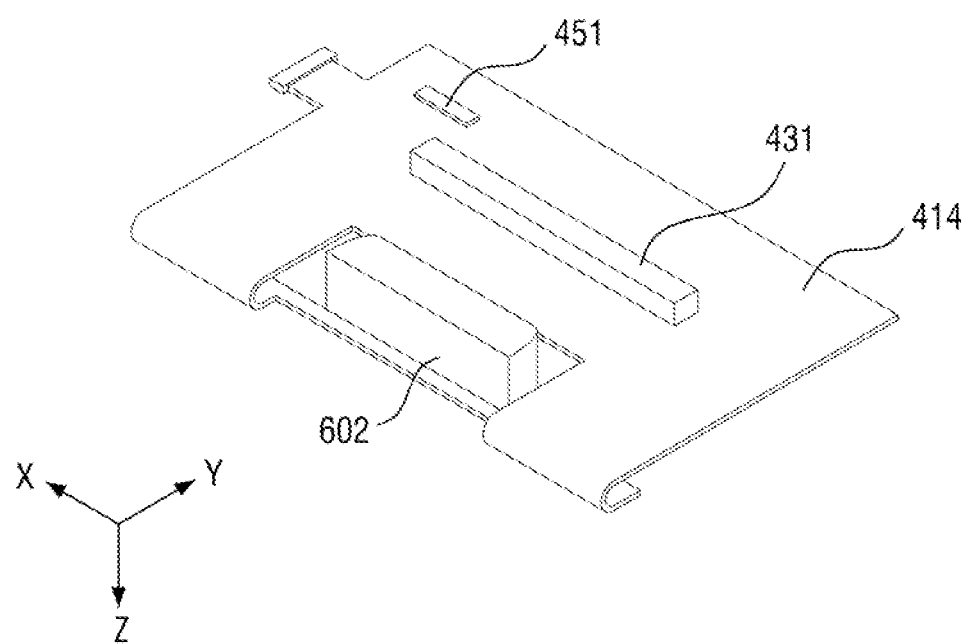
FIG. 20 is a rear perspective view illustrating the module member and the first flexible circuit film of FIG. 19.

FIG. 17 is an exploded perspective view illustrating a display device 4 according to an exemplary embodiment of the present invention. FIG. 18 is a perspective view illustrating a first flexible circuit film 4 of FIG. 17. FIG. 19 is a perspective view showing the layout of the module member 602 and the first flexible circuit film 404 of FIG. 17. FIG. 20 is a rear perspective view illustrating the module member 602 and the first flexible circuit film 404 of FIG. 19.

Referring to FIGS. 17 to 20, the display device according to this embodiment is different from the display device 2 according to the embodiment of FIG. 14 and the like in that the first base film 414 of the first flexible circuit film 404 has an opening 414h in a plan view.

In an exemplary embodiment of the present invention, the first flexible circuit film 404 has the opening 414h, and at least a part of the module member 602 may be located in the opening 414h of the first flexible circuit film 404 in a state in which the first flexible circuit film 404 is curved. For example, in a plan view, the module member 602 may be located in the opening 414h of the first flexible circuit film 404.

In the display device 4 according to an exemplary embodiment of the present invention, the display area DA having a partially indented edge is formed, and the module member 602 is disposed in the indented portion, thereby minimizing the planar area of the non-display area NDA. The present invention is not limited thereto, but even when the module member 602 is relatively thick, the opening 414h is formed in the first flexible circuit film 404 curved toward the back surface of the light-emitting substrate 102, so that the module member 602 and the first flexible circuit film 404 can be disposed so as not to overlap each other in the third direction Z, and the slimming of the display device 4 can be achieved.

Since other configurations of the display device 4 according to this embodiment have been described above with reference to FIG. 1, FIG. 14, and the like, duplicate descriptions thereof will be omitted.

Figure 21:
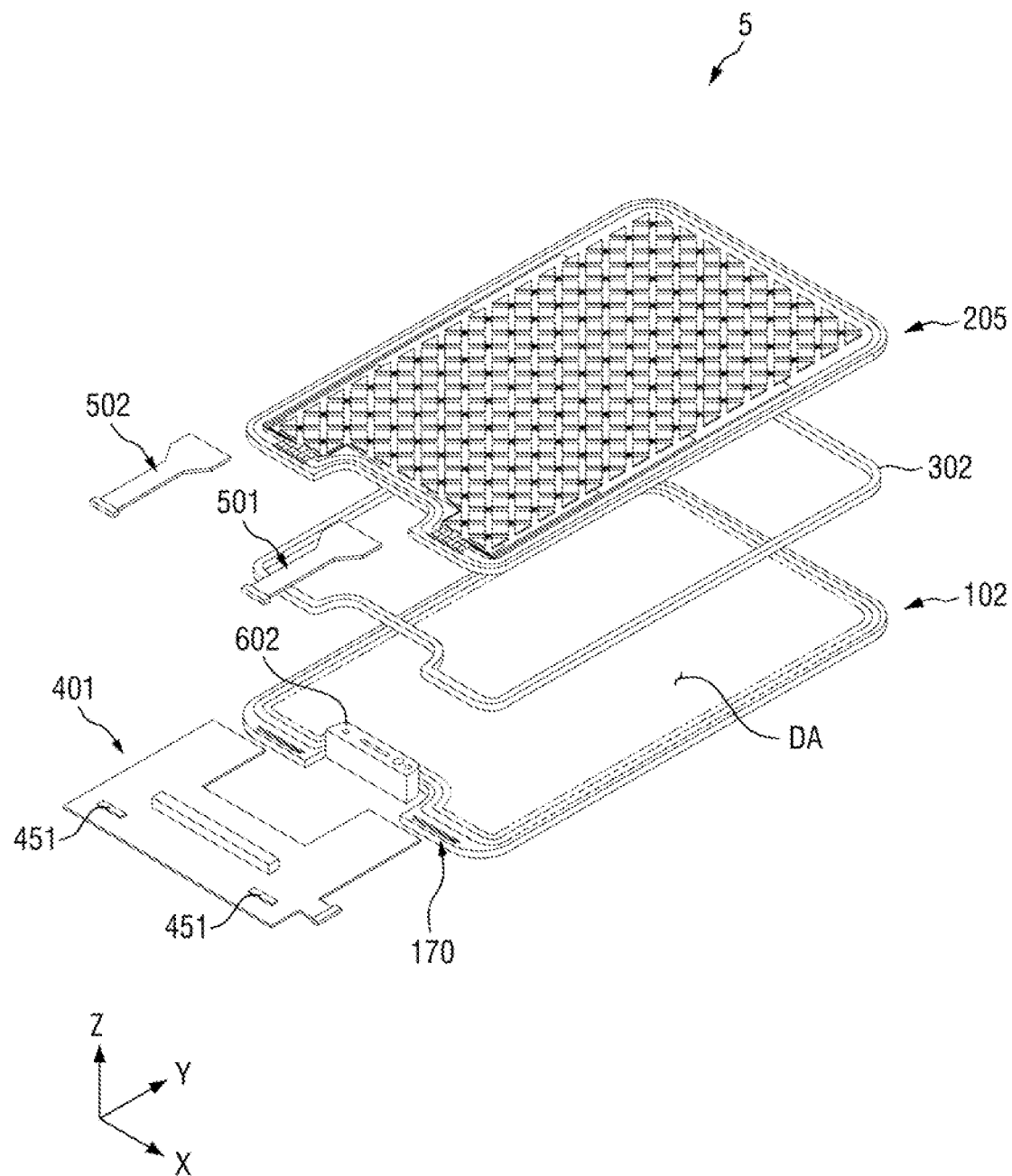
FIG. 21 is an exploded perspective view illustrating a display device according to an exemplary embodiment of the present invention.
Figure 22:
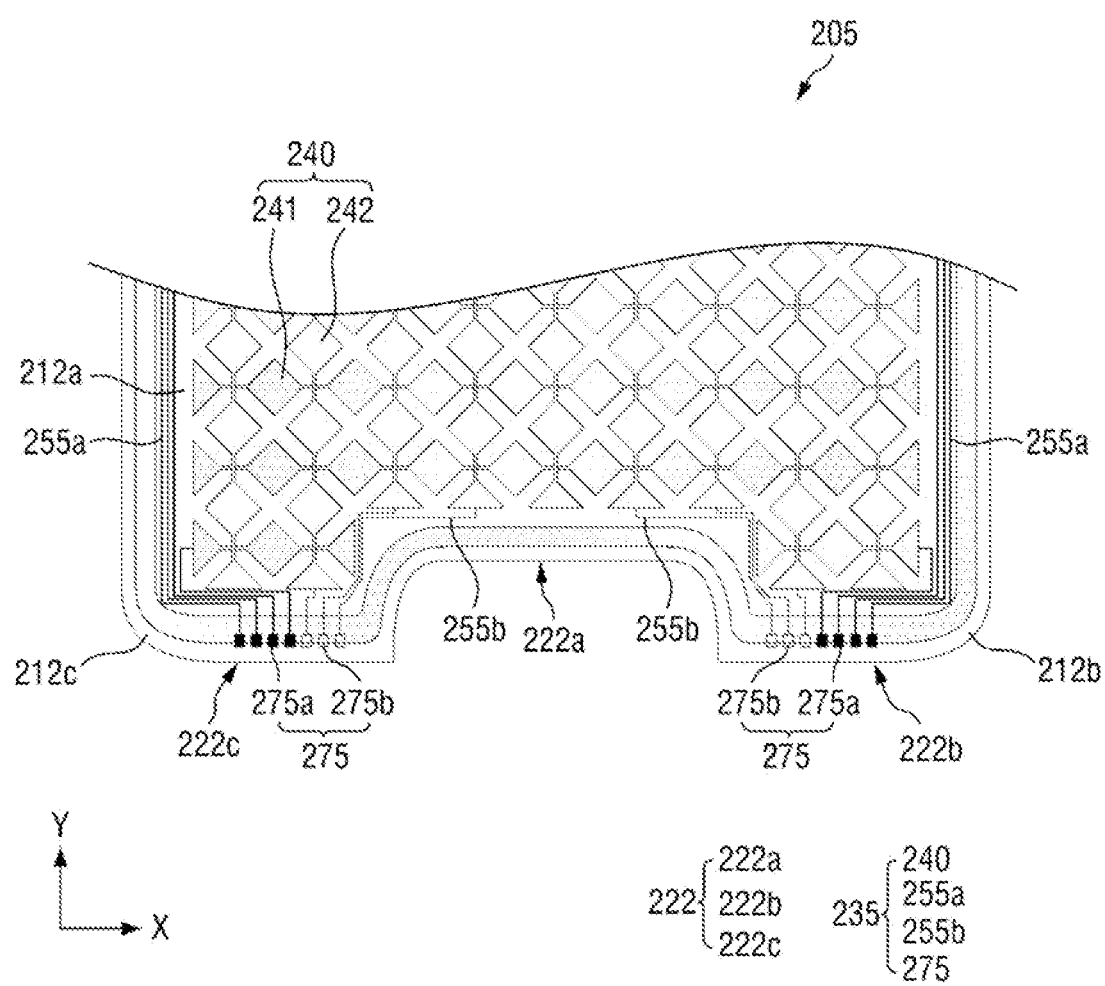
FIG. 22 is a plan view illustrating a touch element layer of the counter substrate of FIG. 21.

FIG. 21 is an exploded perspective view illustrating a display device 5 according to an exemplary embodiment of the present invention. FIG. 22 is a plan view showing a touch element layer 235 of the counter substrate 205 of FIG. 21.

Referring to FIGS. 21 and 22, the display device 5 according to this embodiment is different from the display device according to the embodiment of FIG. 14 and the like in that the touch pad unit 275 of the counter substrate 205 is disposed on the second protruding portion 212c of the second base substrate 212 as well as the first protruding portion 212b of the second base substrate 212.

The touch pad unit 275 may include first pad electrodes 275a connected to the first touch electrode 241 and second pad electrodes 275b connected to the second touch electrode 242. The touch pad unit 275 may be disposed adjacent to one side edge 222 (for example, a lower edge in FIG. 22) of the second base substrate 212 in the second direction Y. In an exemplary embodiment of the present invention, the touch pad unit 275 including the first pad electrode 275a and the second pad electrode 275b is disposed adjacent to the fourth edge 222b and the sixth edge 222c of the second base substrate 212, but might not be disposed adjacent to the fifth edge 222a of the second base substrate 212. For example, the first pad electrode 275a and the second pad electrode 275b may be disposed on the first protruding portion 212b of the second base substrate 212, and the first pad electrode 275a and the second pad electrode 275b may also be disposed on the second protruding portion 212c of the second base substrate 212.

In some exemplary embodiments of the present invention, the display device 5 may further include a third flexible circuit film 502 connected to the touch pad unit 275 of the counter substrate 205. Although FIG. 21 shows a state in which the first flexible circuit film 401, the second flexible circuit film 501, and the third flexible circuit film 502 are unfolded without being curved for convenience of explanation, the first flexible circuit film 401, the second flexible circuit film 501, and the third flexible circuit film 502 may be curved toward the back surface of the light-emitting substrate 102, respectively.

The third flexible circuit film 502 may be curved in the second direction Y with flexibility. The third flexible circuit film 502 may include a third base film having insulation properties and conductive patterns disposed on the third base film. The second flexible circuit film 501 and the third flexible circuit film 502 may be connected to the first connector 451 of the first flexible circuit film 401, respectively.

The light-emitting substrate pad unit 170 of the light-emitting substrate 102 may be connected to the first flexible circuit film 401, and the touch pad unit 275 of the counter substrate 205 may be connected to the second flexible circuit film 501 and the third flexible circuit film 502. For example, the first pad electrode 275a and the second pad electrode 275b disposed on the first protruding portion 212b of the second base substrate 212 (for example, the pad electrode 275a and the second pad electrode 275b disposed on the right side of FIG. 22) may be connected to the second flexible circuit film 501, and the first pad electrode 275a and the second pad electrode 275b disposed on the second protruding portion 212c of the second base substrate 212 (for example, the pad electrode 275a and the second pad electrode 275b disposed on the left side of FIG. 22) may be connected to the third flexible circuit film 502.

In the display device 5 according to an exemplary embodiment of the present invention, the first pad electrode 275a and the second pad electrode 275b may be formed on the first protruding portion 212b and the second protruding portion 212c of the second base substrate 212, respectively. Thus, the indented portion of the second base substrate 212, for example, touch wirings 255a and 255b across the fifth edge 222a of the second base substrate 212 and the touch electrode layer 240, might not be disposed, or the layout of the touch wirings 255a and 255b may be minimized, and the shortest distance between the fifth edge 222a and the display area DA may be reduced.

Since other configurations of the display device 5 according to this embodiment have been described above with reference to FIG. 1, FIG. 14, and the like, duplicate descriptions thereof will be omitted.

Figure 23:
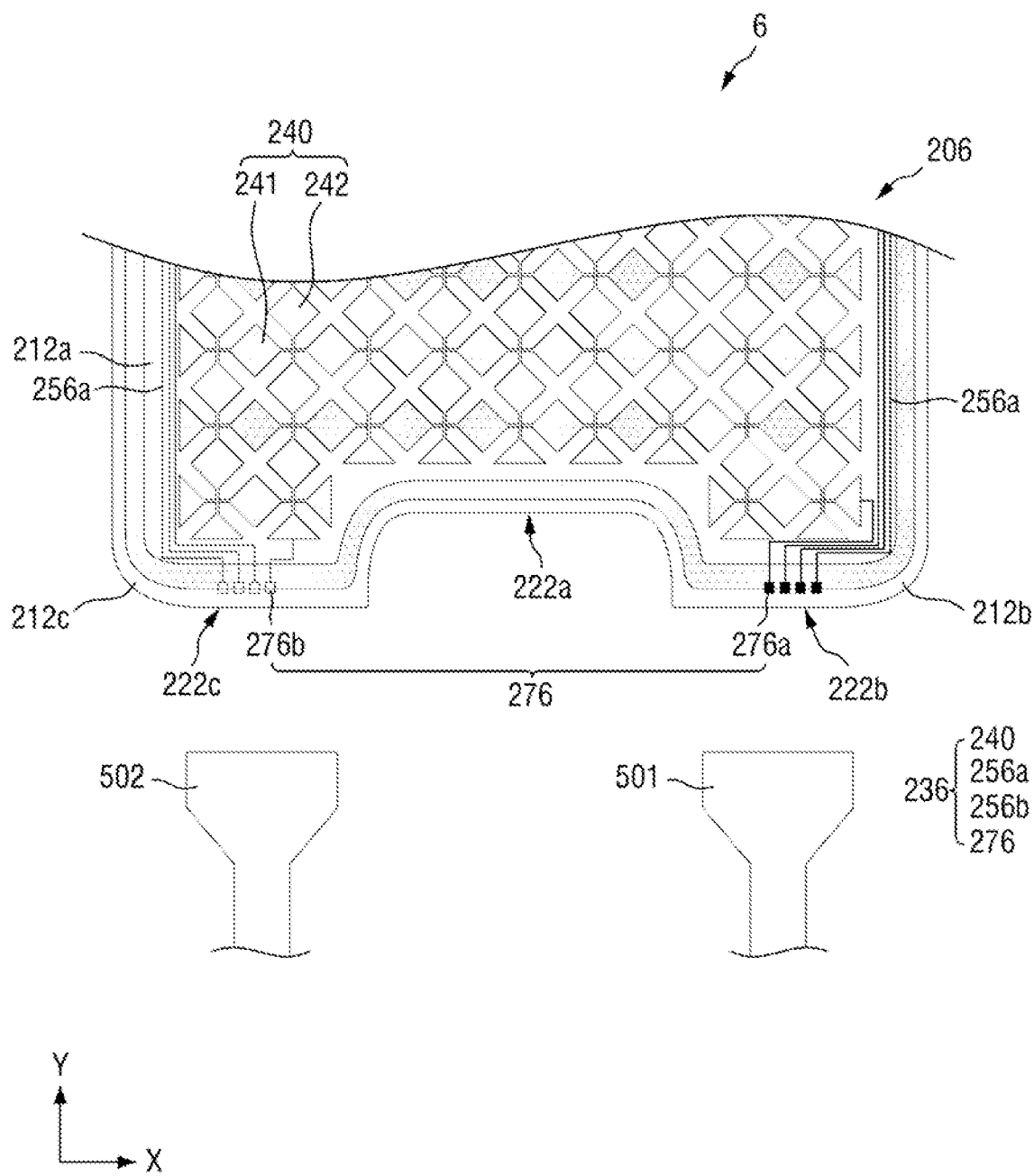
FIG. 23 is a plan view illustrating a touch element layer, a second flexible circuit film, and a third flexible circuit film of a counter substrate of a display device according to an exemplary embodiment of the present invention.

FIG. 23 is a plan view showing a touch element layer 236, a second flexible circuit film 501, and a third flexible circuit film 502 of a counter substrate 206 of a display device 6 according to an exemplary embodiment of the present invention.

Referring to FIG. 23, the display device 6 according to this embodiment is different from the display device 5 according to the embodiment of FIG. 21 and the like in that the touch pad unit 276 of the counter substrate 206 of the display device 6 includes a first pad electrode 276a and a second pad electrode 276b, the first pad electrode 276a is disposed on the first protruding portion 212b of the second base substrate 212, and the second pad electrode 276b is disposed on the second protruding portion 212c of the second base substrate 212.

The touch pad unit 276 may include first pad electrodes 276a connected to the first touch electrode 241 and second pad electrodes 276b connected to the second touch electrode 242. In an exemplary embodiment of the present invention, the first pad electrode 276a may be disposed adjacent to the fourth edge 222b of the second base substrate 212, and the second pad electrode 276b may be disposed adjacent the sixth edge 222c of the second base substrate 212. For example, the first pad electrode 276a is disposed on the first protruding portion 212b of the second base substrate 212, but the second pad electrode 276b might not be disposed thereon. Further, the second pad electrode 276b is disposed on the second protruding portion 212c of the second base substrate 212, but the first pad electrode 276a might not be disposed thereon.

The second flexible circuit film 501 may be connected to the first pad electrode 276a connected to the first touch electrode 241 to transmit only a sensing signal, and the third flexible circuit film 502 may be connected to the second pad electrode 276b connected to the second touch electrode 242 to transmit only a driving signal. In the display device 6, according to an exemplary embodiment of the present invention, the sensing signal provided to the first touch electrode 241 and the driving signal provided to the second touch electrode 242 may be different from each other in a signal transmitting path. Thus, noise can be minimized, and coordinate information about a user's touch operation can be acquired more precisely. Further, touch wirings 256a and 256b across the fifth edge 222a of the second base substrate 212 and the touch electrode layer 240 might not be disposed or the layout of the touch wirings 256a and 256b can be minimized.

Since other configurations of the display device 6 according to this embodiment have been described above with reference to FIG. 1, FIG. 14, FIG. 21, and the like, duplicate descriptions thereof will be omitted.

Figure 24:
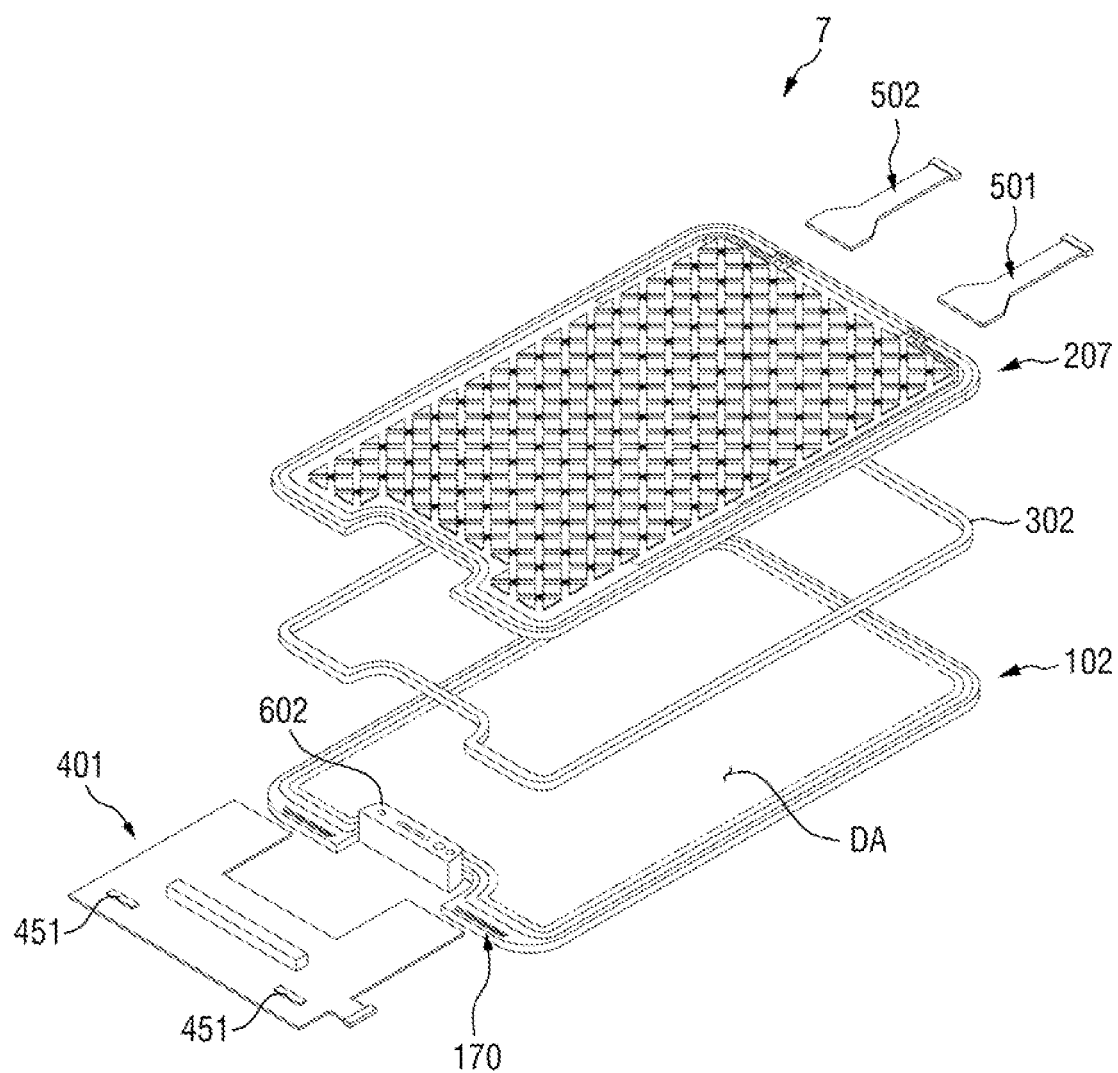
FIG. 24 is an exploded perspective view illustrating a display device according to an exemplary embodiment of the present invention.
Figure 25:
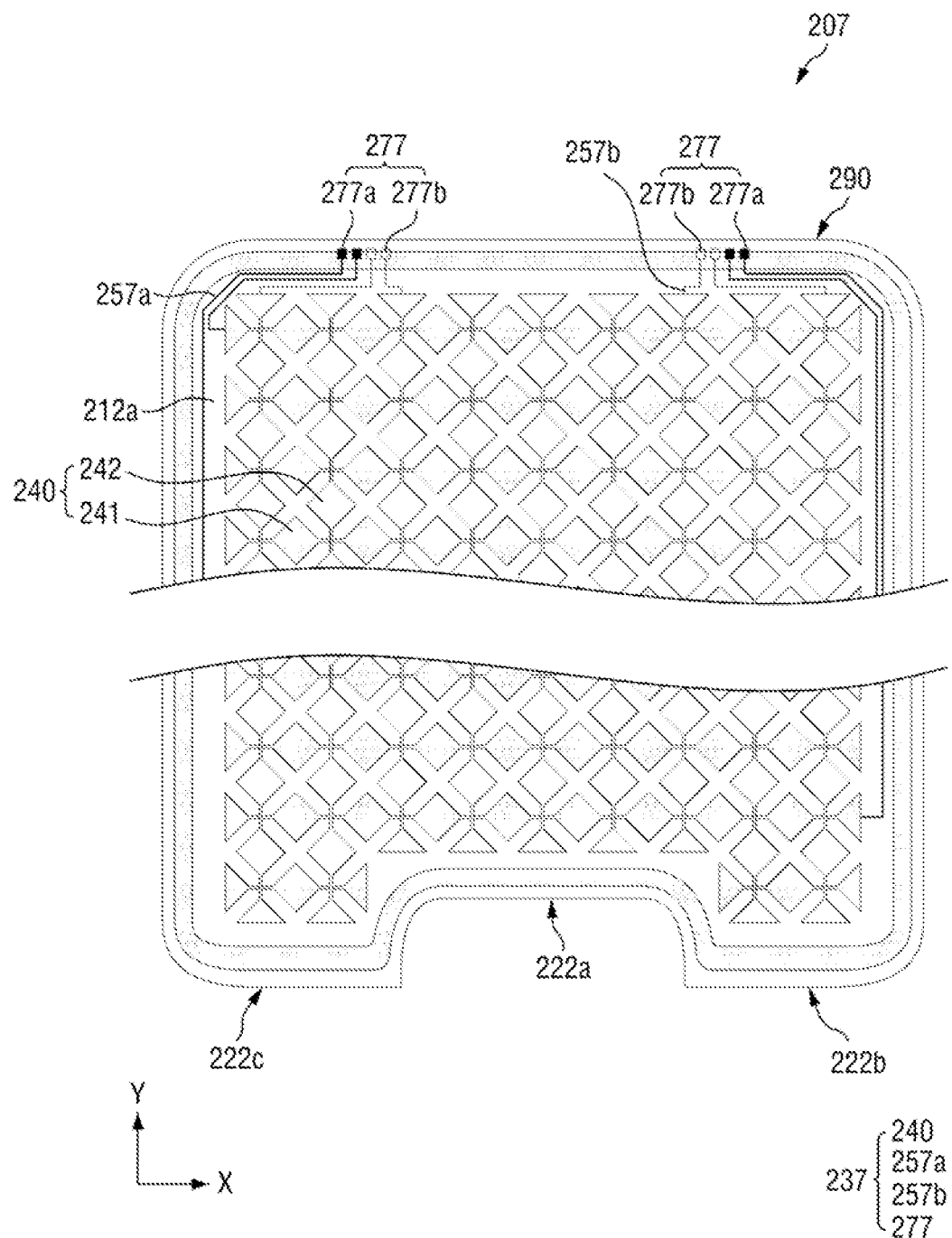
FIG. 25 is a plan view illustrating a touch element layer of the counter substrate of FIG. 24.

FIG. 24 is an exploded perspective view illustrating a display device 7 according to an exemplary embodiment of the present invention. FIG. 25 is a plan view showing a touch element layer 237 of the counter substrate 207 of FIG. 24.

Referring to FIGS. 24 and 25, the display device 7 according to this embodiment is different from the display device 5 according to the embodiment of FIG. 21 and the like in that the touch pad unit 277 of the counter substrate 207 of the display device 7 is disposed on the main portion 212a of the second base substrate 212 without being disposed on the first protruding portion 212b and the second protruding portion 212c of the second base substrate 212.

The touch pad unit 277 may include first pad electrodes 277a connected to the first touch electrode 241 and second pad electrodes 277b connected to the second touch electrode 242. The touch pad unit 277 may be disposed adjacent to the other side edge 290 of the second base substrate 212 in the second direction Y. For example, in a plan view, the light-emitting substrate pad unit 170 and the touch pad unit 277 may be located on one side and the other side of the display area DA in the second direction Y, respectively.

Although FIG. 24 shows a state in which the first flexible circuit film 401, the second flexible circuit film 501, and the third flexible circuit film 502 are unfolded without being curved for convenience of explanation, the first flexible circuit film 401, the second flexible circuit film 501, and the third flexible circuit film 502 may be curved toward the back surface of the light-emitting substrate 102, respectively. Further, the second flexible circuit film 501 and the third flexible circuit film 502 may be connected to the connectors 451 of the first flexible circuit film 401, respectively.

Since other configurations of the display device 7 according to this embodiment have been described above with reference to FIG. 1, FIG. 14, FIG. 21, and the like, duplicate descriptions thereof will be omitted.

Figure 26:
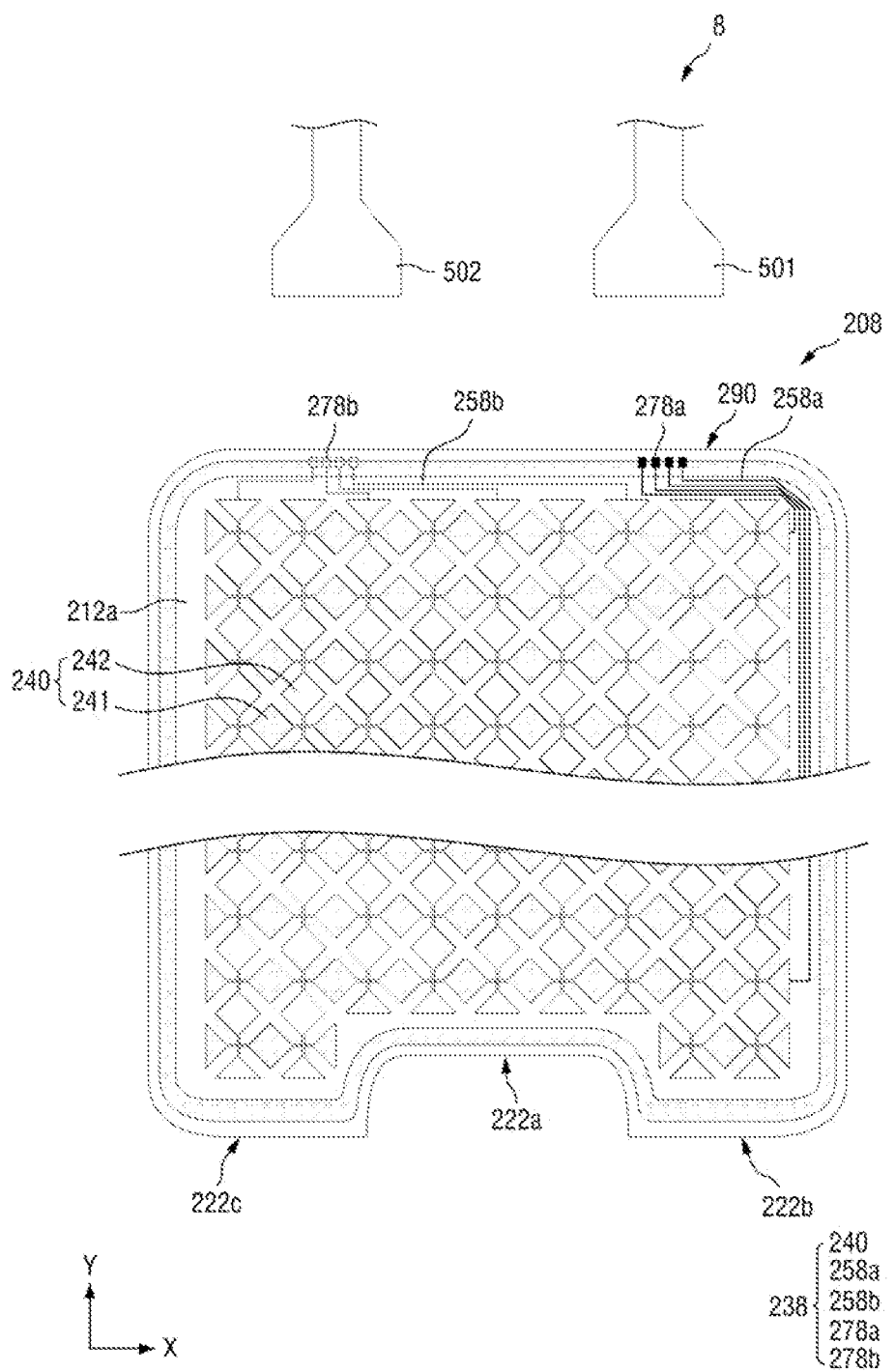
FIG. 26 is a plan view illustrating a touch element layer, a second flexible circuit film, and a third flexible circuit film of a counter substrate of a display device according to an exemplary embodiment of the present invention.

FIG. 26 is a plan view showing a touch element layer 238, a second flexible circuit film 501, and a third flexible circuit film 502 of a counter substrate 208 of a display device 8 according to an exemplary embodiment of the present invention.

Referring to FIG. 26, the display device 8 according to this embodiment is different from the display device 7 according to the embodiment of FIG. 24 and the like in that the second flexible circuit film 501 of the display device 8 is connected to the first pad electrode 278a to transmit only a sensing signal, and the third flexible circuit film 502 thereof is connected to the second pad electrode 278b to transmit only a driving signal.

Since other configurations of the display device 8 according to this embodiment have been described above with reference to FIG. 1, FIG. 14, FIG. 21, FIG. 24, and the like, duplicate descriptions thereof will be omitted.

According to the display devices of embodiments, the ratio of a display area to the total area of the display device in a plan view can be increased, and durability of the display device can be increased.

The effects of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention.

What is claimed is:

1. An electronic device, comprising:
   a display panel including:
      a main portion including a first side extended in a first direction,
      a first protruding portion protruding from a first side of the main portion in a second direction different from the first direction, and
      a second protruding portion protruding from the first side of the main portion in the second direction, and
   a flexible circuit film connected to the display panel,
   wherein the first protruding portion and the second protruding portion are spaced apart from each other with a notch between in the first direction,
   wherein the second protruding portion incudes a pad portion connected to the flexible circuit film, and
   wherein the main portion, the first protruding portion, and the second protruding portion each includes light emitting elements.

2. The electronic device of claim 1, wherein the flexible circuit film includes a first portion connected to the pad portion, a second portion facing a back surface of the display panel and a bent portion disposed between the first portion and the second portion.

3. The electronic device of claim 1,
   wherein the display panel includes:
   a first base substrate,
   the light-emitting elements of the main portion, the first protruding portion, and the second protruding portion disposed on a first surface of the first base substrate, and
   a touch electrode layer disposed on the light-emitting elements of the main portion, the first protruding portion, and the second protruding portion,
   wherein the pad portion is electrically connected to the touch electrode layer.

4. The electronic device of claim 3, wherein a portion of the flexible circuit film faces a second surface of the first base substrate opposite to the first surface.

5. The electronic device of claim 3,
   wherein the display panel further includes a second base substrate disposed over the light-emitting elements of the main portion, the first protruding portion, and the second protruding portion and a sealing member disposed between the first base substrate and the second base substrate,
   wherein the pad portion and the touch electrode layer are disposed on the second base substrate, and
   wherein the pad portion overlaps the sealing member.

6. The electronic device of claim 5,
   wherein the display panel further includes a touch wiring electrically connecting the pad portion and the touch electrode layer, and
   wherein the touch wiring overlaps the sealing member.

7. The electronic device of claim 6, wherein any portion of the touch wiring is not disposed outside the sealing member in a plan view.

8. The electronic device of claim 5, wherein the sealing member forms a closed curve in a plan view, and
   wherein at least a part of the pad portion is located outside the sealing member in the plan view.

9. The electronic device of claim 3,
   wherein the touch electrode layer includes:
   a plurality of first touch electrodes arranged in the first direction,
   a plurality of second touch electrodes arranged in the second direction, a first connect portion disposed between two adjacent first touch electrodes of the plurality of first touch electrode in the first direction, and
a second connect portion disposed between two adjacent second touch electrodes of the plurality of second touch electrode in the second direction, and
wherein the first connect portion and the second connect portion overlap each other.

10. The electronic device of claim 8,
wherein the plurality of first touch electrodes and the first connect portion is disposed in a first layer, and
wherein the second connect portion is disposed in a second layer different from the first layer.

11. The electronic device of claim 1, further comprising:
a module member at least partially disposed between the first protruding portion and the second protruding portion in a plan view, the module member including an optical sensor or a speaker.

12. The electronic device of claim 1,
wherein a width of the main portion in the first direction is larger than a width of the first protruding portion in the first direction, and
wherein the width of the main portion in the first direction is larger than a width of the second protruding portion in the first direction.

13. The electronic device of claim 12,
wherein a width of the main portion in the second direction is larger than a width of the first protruding portion in the second direction, and
wherein the width of the main portion in the second direction is larger than a width of the second protruding portion in the second direction.

14. An electronic device, comprising:
a display panel including:
 a main portion including a first side extended in a first direction and a second side opposite to the first side in a second direction different from the first direction,
 a first protruding portion protruding from a first side of the main portion in a second direction different from the first direction, and
 a second protruding portion protruding from the first side of the main portion in the second direction, the second protruding portion including a first pad portion;
a first flexible circuit film connected to the first pad portion; and
a second flexible circuit film connected to the display panel,
wherein the first protruding portion and the second protruding portion are spaced apart from each other with a notch between in the first direction,
wherein the main portion incudes a second pad portion adjacent to the second side,
wherein the second flexible circuit film is connected to the second pad portion, and
wherein the main portion, the first protruding portion, and the second protruding portion each incudes light emitting elements.

15. The electronic device of claim 14, wherein each of the first flexible circuit film and the second flexible circuit film includes a first portion connected to the pad portion, a second portion facing a back surface of the display panel and a bent portion disposed between the first portion and the second portion.

16. The electronic device of claim 14,
wherein the display panel includes:
a first base substrate,
the light-emitting elements of the main portion, the first protruding portion, and the second protruding portion disposed on a first surface of the first base substrate, and
a touch electrode layer disposed on the light-emitting elements of the main portion, the first protruding portion, and the second protruding portion,
wherein one of the first pad portion and the second pad portion is electrically connected to the light-emitting elements of the main portion, the first protruding portion, and the second protruding portion, and
wherein another one of the first pad portion and the second pad portion is electrically connected to the touch electrode layer.

17. The electronic device of claim 16 wherein a portion of the first flexible circuit film and a portion of the second flexible circuit film face a second surface of the first base substrate opposite to the first surface.

18. The electronic device of claim 16,
wherein the display panel further includes a second base substrate disposed over the light-emitting elements of the main portion, the first protruding portion, and the second protruding portion and a sealing member disposed between the first base substrate and the second base substrate,
wherein the one of the first pad portion and the second pad portion is disposed on the first surface of the first base substrate,
wherein the touch electrode layer and the another of the first pad portion and the second pad portion are disposed on the second base substrate, and
wherein the another of the first pad portion and the second pad portion overlaps the scaling member.

19. The electronic device of claim 14, further comprising:
a module member at least partially disposed between the first protruding portion and the second protruding portion in a plan view, the module member including an optical sensor or a speaker.

20. The electronic device of claim 19, wherein one side edge of the second flexible circuit film has a partially indented shape, and
wherein the module member is located in a bay or notch of the second flexible circuit film in the plan view.

21. The electronic device of claim 19, wherein the second flexible circuit film has an opening, and
wherein the module member is inserted in the opening in a state in which the second flexible circuit film is bent.

* * * * *